United States Patent
Chou et al.

(10) Patent No.: US 12,426,300 B2
(45) Date of Patent: Sep. 23, 2025

(54) TRANSISTOR SOURCE/DRAIN CONTACTS AND METHODS OF FORMING THE SAME

(71) Applicant: Taiwan Semiconductor Manufacturing Co., Ltd., Hsinchu (TW)

(72) Inventors: Meng-Han Chou, Hsinchu (TW); Yi-Syuan Siao, Changhua (TW); Su-Hao Liu, Jhongpu Township (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 481 days.

(21) Appl. No.: 17/743,861

(22) Filed: May 13, 2022

(65) Prior Publication Data
US 2023/0261069 A1 Aug. 17, 2023

Related U.S. Application Data

(60) Provisional application No. 63/268,181, filed on Feb. 17, 2022.

(51) Int. Cl.
*H10D 30/62* (2025.01)
*H10D 30/01* (2025.01)
*H10D 84/01* (2025.01)
*H10D 84/03* (2025.01)
*H10D 84/83* (2025.01)

(52) U.S. Cl.
CPC ....... *H10D 30/6219* (2025.01); *H10D 30/024* (2025.01); *H10D 30/6211* (2025.01); *H10D 84/013* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

FOREIGN PATENT DOCUMENTS

| | | |
|---|---|---|
| TW | 202004859 A | 1/2020 |
| TW | 202013614 A | 4/2020 |
| TW | 202109680 A | 3/2021 |

*Primary Examiner* — Bilkis Jahan
(74) *Attorney, Agent, or Firm* — Slater Matsil, LLP

(57) ABSTRACT

In an embodiment, a device includes: a source/drain region adjacent a channel region; an inter-layer dielectric on the source/drain region; a source/drain contact extending through the inter-layer dielectric and into the source/drain region; a metal-semiconductor alloy region between the source/drain contact and the source/drain region, the metal-semiconductor alloy region disposed beneath a top surface of the channel region, the metal-semiconductor alloy region including a first dopant; and a contact spacer around the source/drain contact, the contact spacer including the first dopant and an amorphizing impurity.

20 Claims, 40 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,755,019 B1* | 9/2017 | Fung .................. H01L 29/0847 |
| 9,831,183 B2 | 11/2017 | Lin et al. |
| 9,859,386 B2 | 1/2018 | Ho et al. |
| 10,347,762 B1 | 7/2019 | Liu et al. |
| 10,923,565 B2 | 2/2021 | Lee et al. |
| 2017/0243760 A1* | 8/2017 | Chao .................. H10D 30/6219 |
| 2017/0256456 A1* | 9/2017 | Lee .................... H10D 30/024 |
| 2019/0131399 A1* | 5/2019 | Liu .................. H01L 21/02532 |
| 2019/0165099 A1* | 5/2019 | Chen .................... H10D 30/62 |
| 2022/0359755 A1 | 11/2022 | Liu et al. |

\* cited by examiner

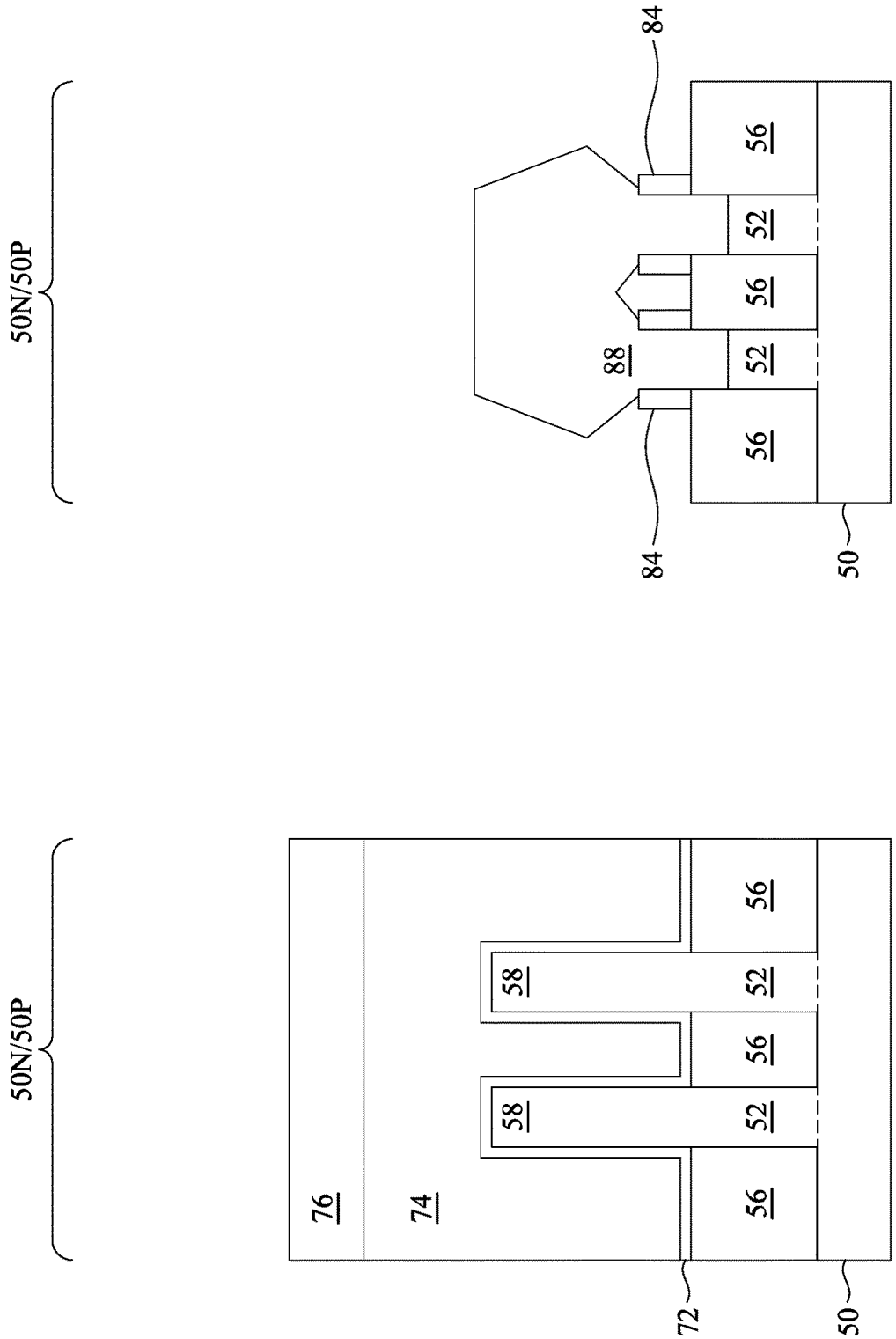

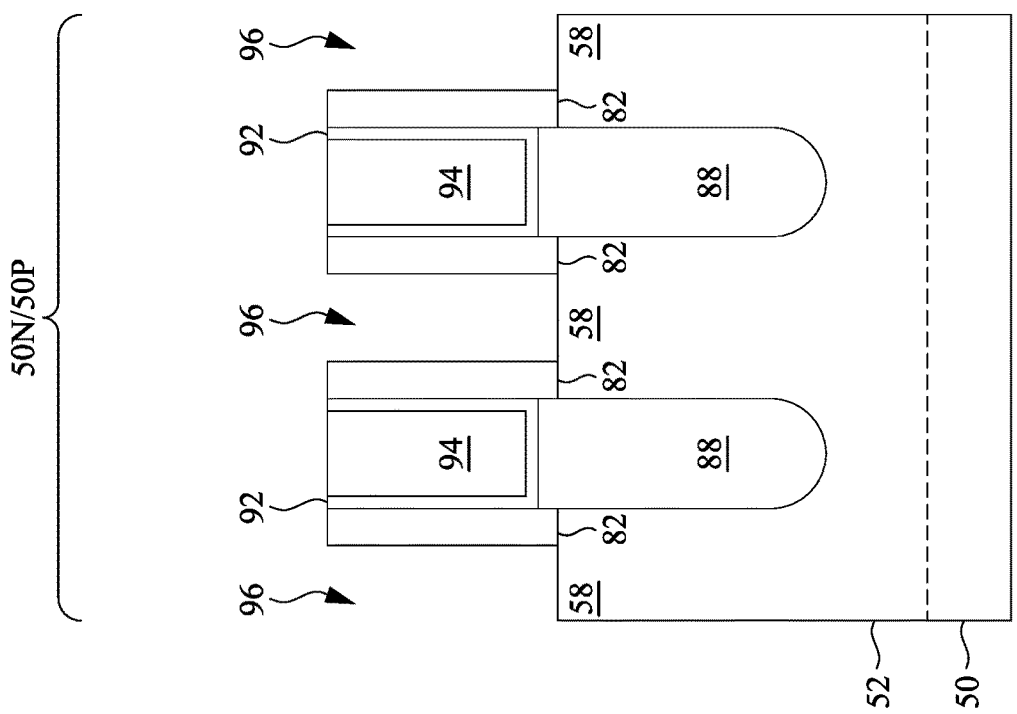

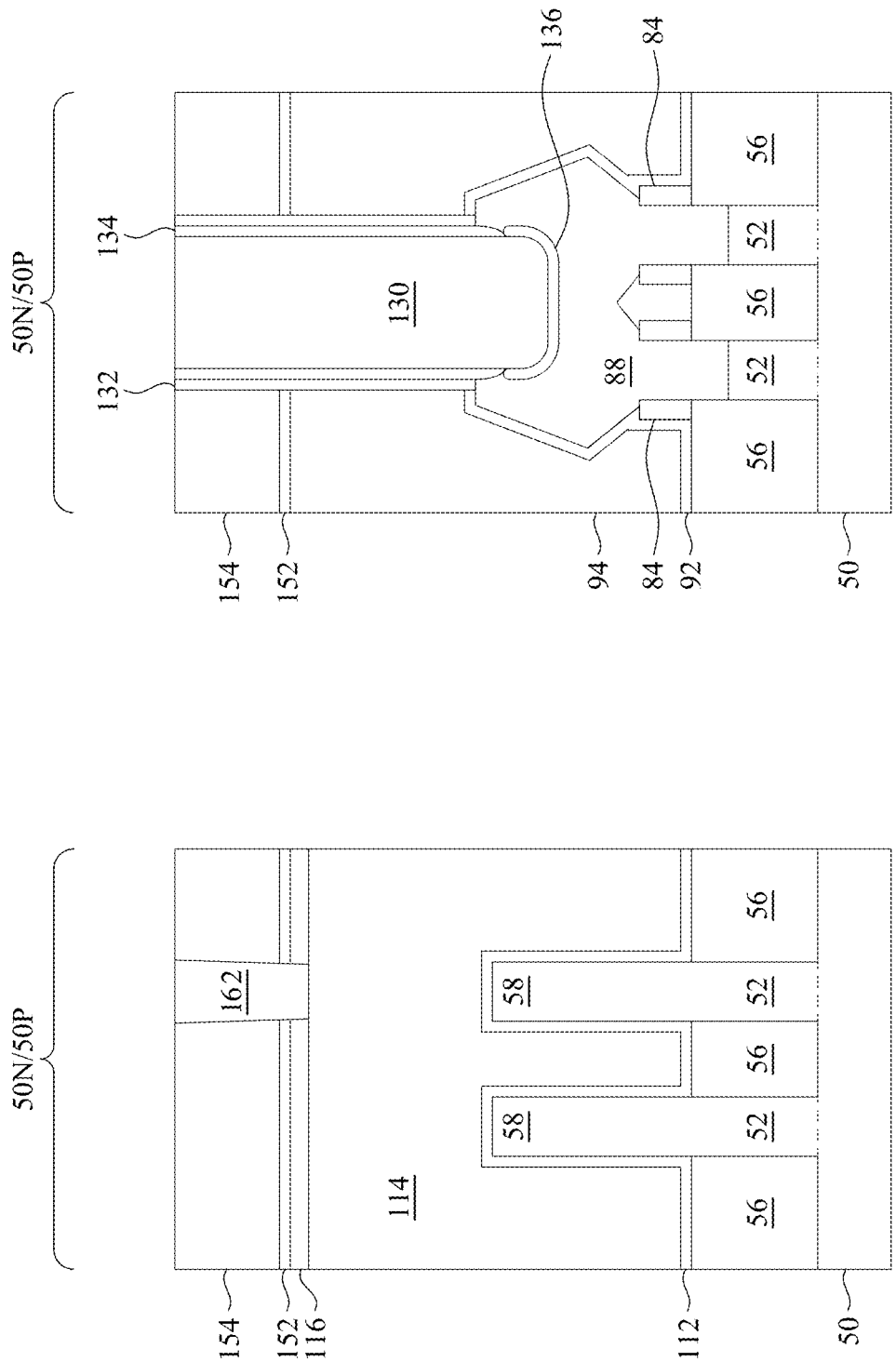

TRANSISTOR SOURCE/DRAIN CONTACTS AND METHODS OF FORMING THE SAME

PRIORITY CLAIM AND CROSS-REFERENCE

This application claims the benefit of U.S. Provisional Application No. 63/268,181, filed on Feb. 17, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 26A-26C are views of FinFETs, in accordance with some other embodiments.

DETAILED DESCRIPTION

Figure 1:
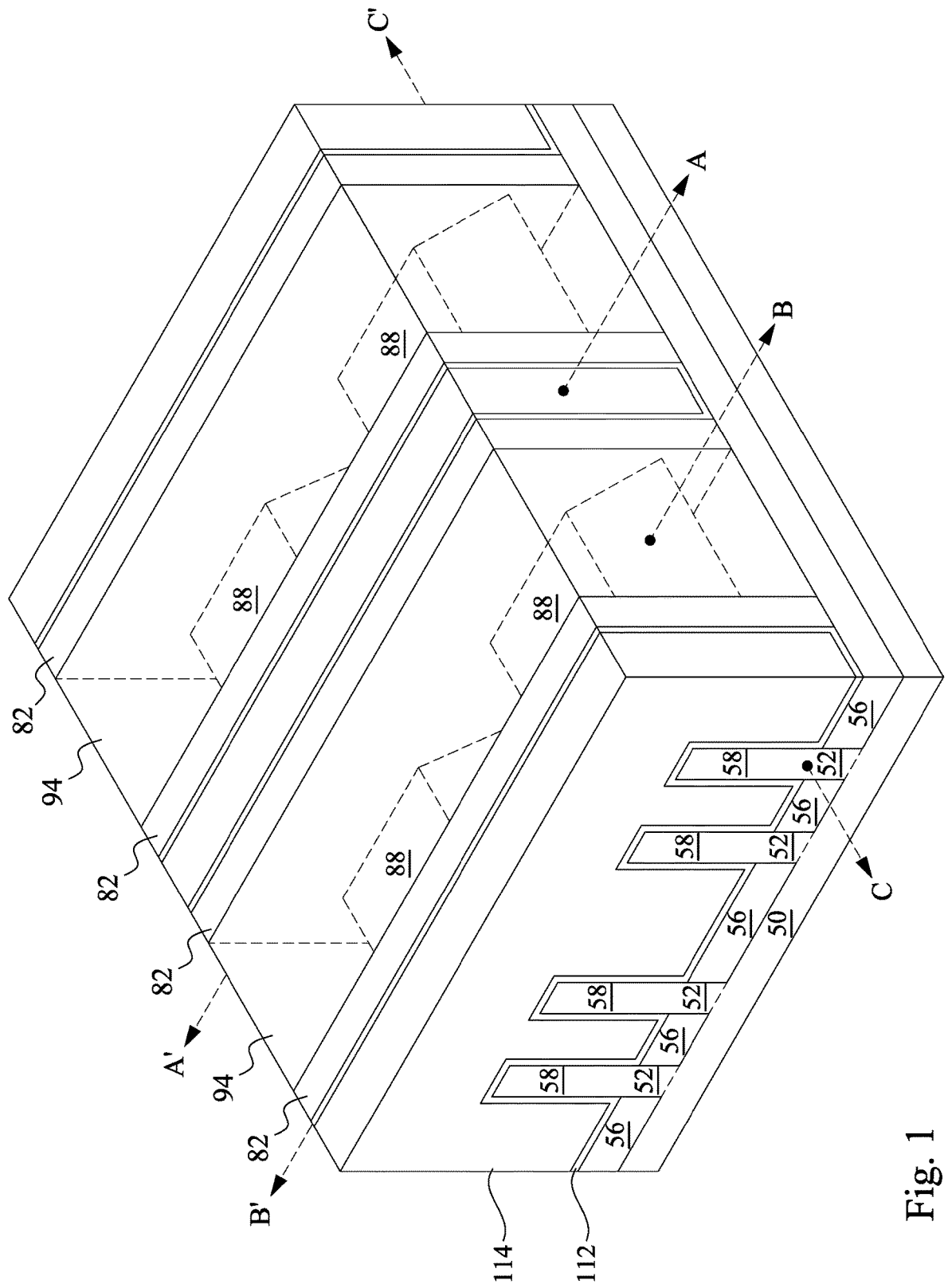
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, recesses for contacts are formed extending into epitaxial source/drain regions. Forming the recesses extending into the epitaxial source/drain regions increases the contact area to the epitaxial source/drain regions. An implantation process is performed after the recesses are formed in the epitaxial source/drain regions, thereby increasing the dopant concentration in the portions of the epitaxial source/drain regions at the bottoms of the recesses. Metal-semiconductor alloy regions may thus be formed in the recesses with a high dopant concentration, which may further reduce the contact resistance to the epitaxial source/drain regions.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials.

Gate dielectrics 112 are along sidewalls and over top surfaces of the fins 52. Gate electrodes 114 are over the gate dielectrics 112. Epitaxial source/drain regions 88 are disposed in opposite sides of the fin 52 with respect to the gate dielectrics 112 and gate electrodes 114. Gate spacers 82 separate the epitaxial source/drain regions 88 from the gate dielectrics 112 and the gate electrodes 114. An inter-layer dielectric (ILD) 94 is formed over the epitaxial source/drain regions 88. Contacts (subsequently described) to the epitaxial source/drain regions 88 will be formed through the ILD 94. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact. In this context, a "source/drain region" of a transistor is a semiconductor region that acts as a source region or a drain region for that transistor.

FIG. 1 further illustrates reference cross-sections that are used in later figures. Cross-section A-A' is along a longitudinal axis of a gate electrode 114. Cross-section B-B' is parallel to cross-section A-A' and extends through epitaxial source/drain regions 88 of the FinFETs. Cross-section C-C' is along a longitudinal axis of a fin 52 and in a direction of, for example, a current flow between the epitaxial source/drain regions 88 of a FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2-25C are views of intermediate stages in the manufacturing of FinFETs, in accordance with some embodiments. FIGS. 2, 3, 4, and 5 are three-dimensional views showing a similar three-dimensional view as FIG. 1. FIGS. 6A, 7A, 8A, 9A, 10A, 11A, 12A, 13A, 14A, 15A, 24A, and 25A are cross-sectional views illustrated along a similar cross-section as reference cross-section A-A' in FIG. 1. FIGS. 6B, 7B, 8B, 9B, 10B, 11B, 12B, 13B, 14B, 15B, 24B, and 25B are cross-sectional views illustrated along a similar cross-section as reference cross-section B-B' in FIG. 1. FIGS. 6C, 7C, 8C, 9C, 10C, 11C, 12C, 13C, 14C, 15C, 16, 17, 18, 19, 20, 21, 22, 23, 24C, and 25C are cross-sectional views illustrated along a similar cross-section as reference cross-section C-C' in FIG. 1.

Figure 2:
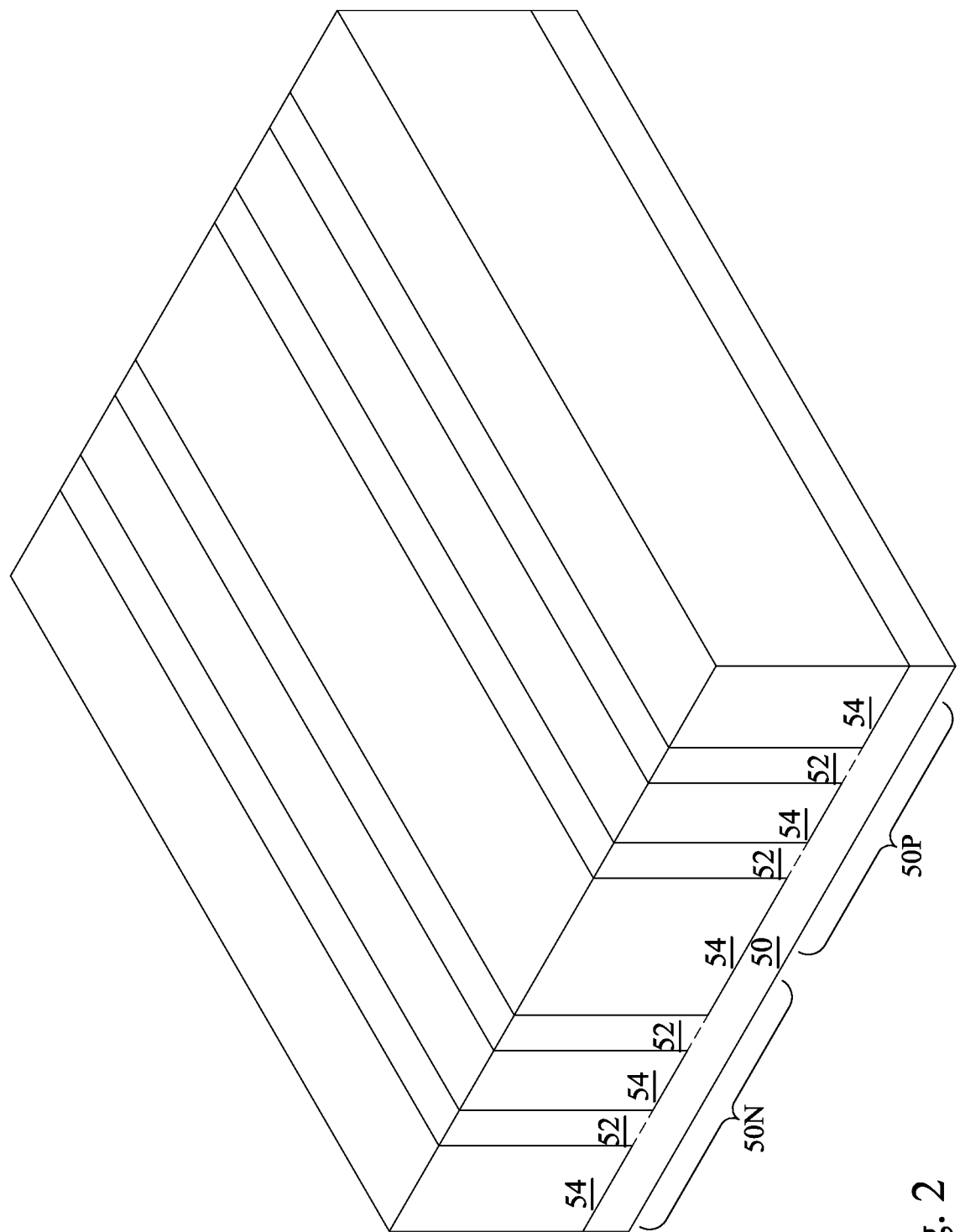
FIGS. 2-25C are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips, and may also be referred to as semiconductor fin. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

An insulation material 54 is formed over the substrate 50 and between neighboring fins 52. The insulation material 54 may be an oxide, such as silicon oxide, a nitride, the like, or a combination thereof, and may be formed by a chemical vapor deposition (CVD) process, such as a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as one of the insulation materials previously described may be formed over the liner.

In an embodiment, the insulation material 54 is formed such that excess insulation material 54 covers the fins 52. A removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are substantially coplanar (within process variations) after the planarization process is complete. In embodiments in which a mask remains on the fins 52, the planarization process may expose the mask or remove the mask such that top surfaces of the mask or the fins 52, respectively, and the insulation material 54 are substantially coplanar (within process variations) after the planarization process is complete The process previously described is just one example of how the fins 52 and the insulation material 54 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming the III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 3:
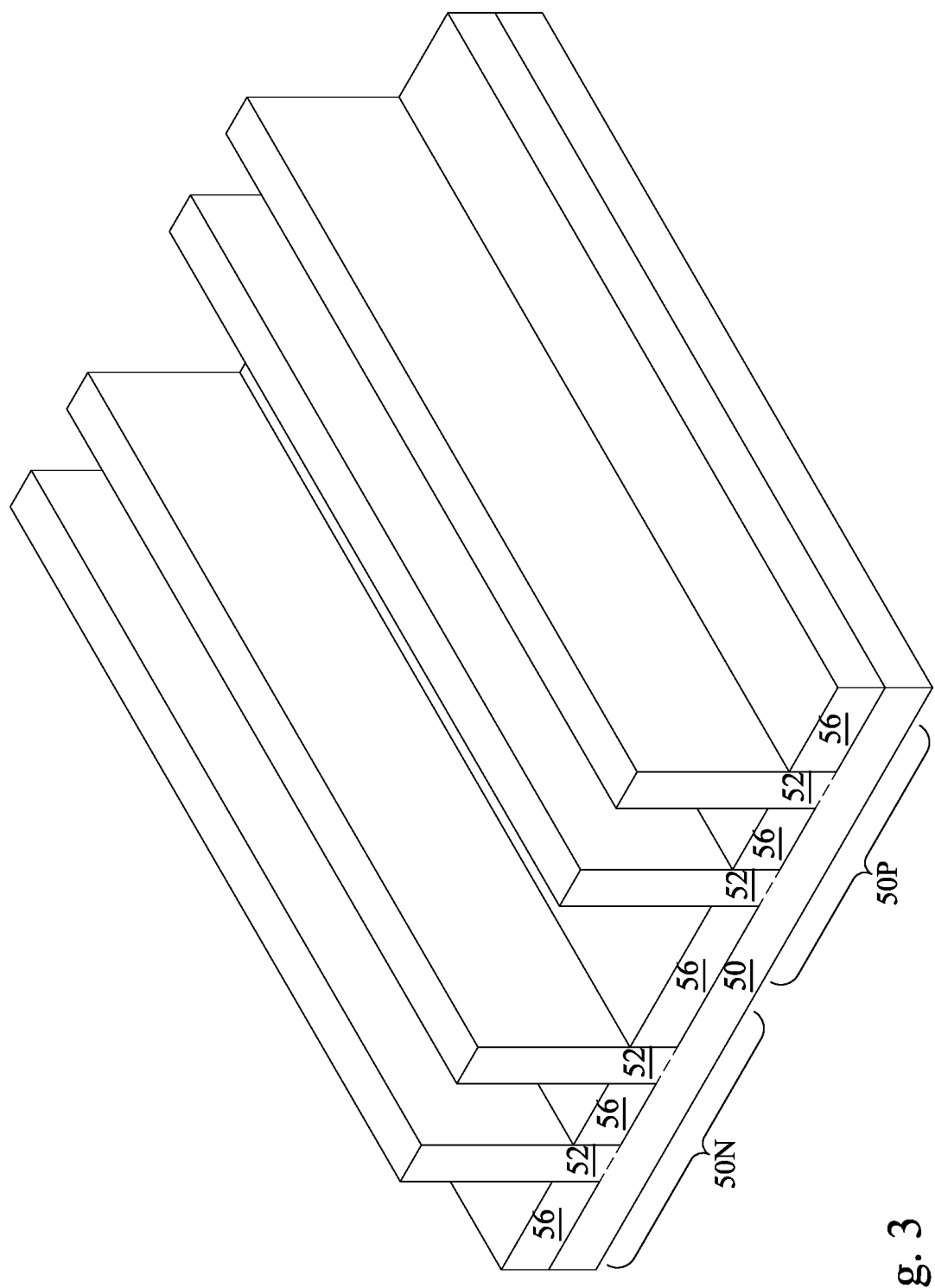

In FIG. 3, the insulation material 54 is recessed to form STI regions 56. The insulation material 54 is recessed such that upper portions of fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal may be performed using dilute hydrofluoric (dHF) acid.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In the embodiments with different well types, the different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

Figure 4:
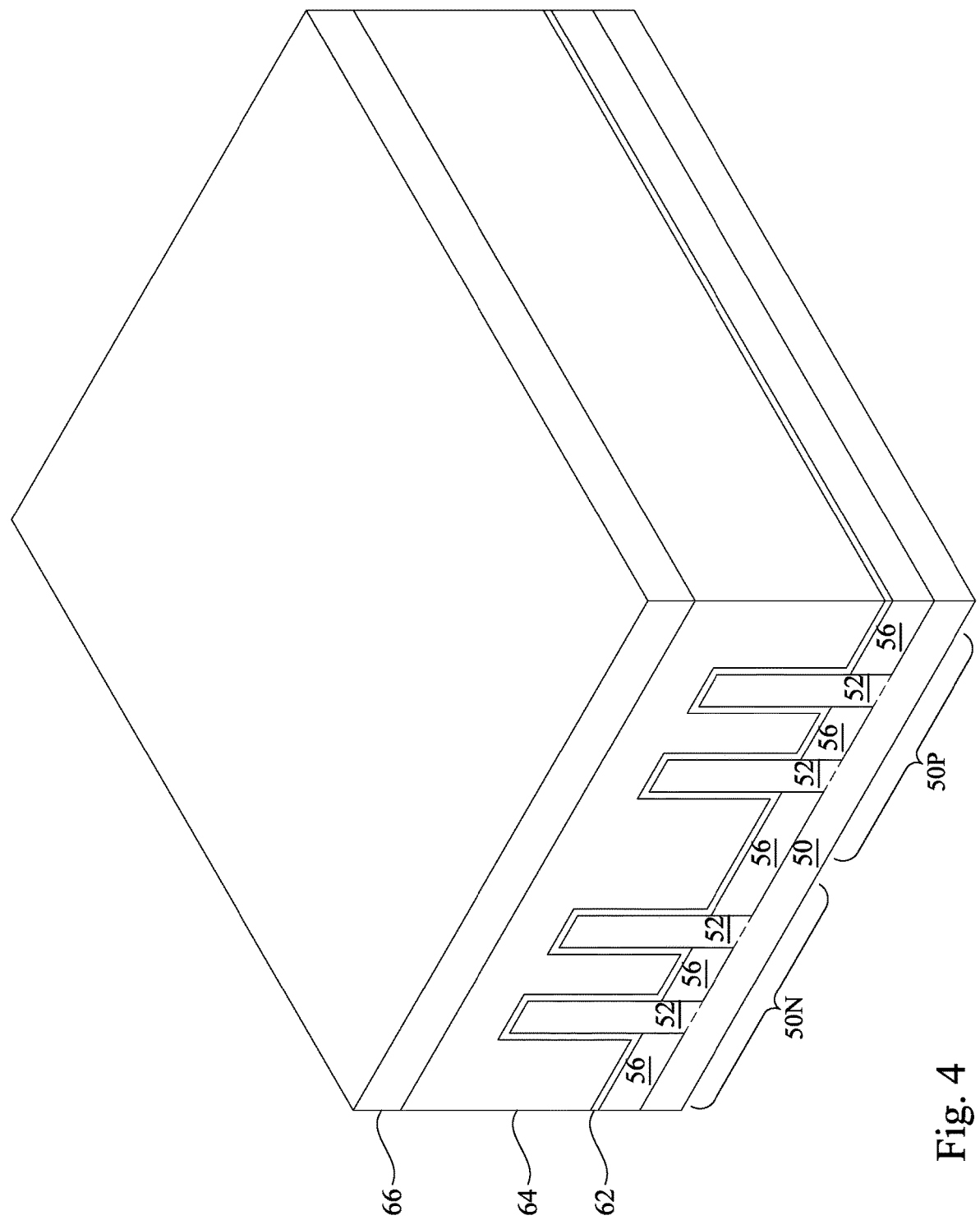

In FIG. 4, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

Figure 5:
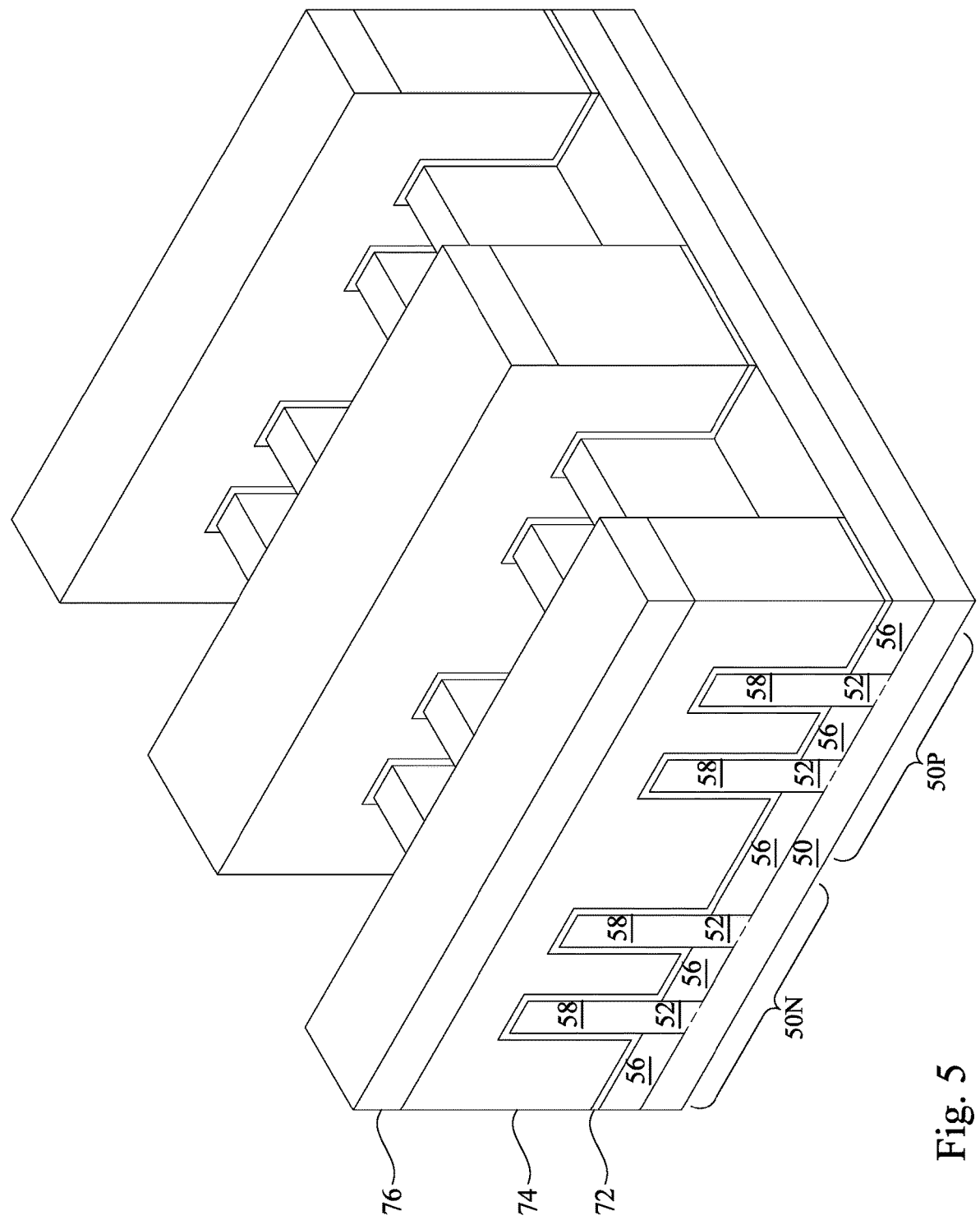

In FIG. 5, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 6A-25C illustrate various additional steps in the manufacturing of embodiment devices. FIGS. 6A-25C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figures 6A, 6B:
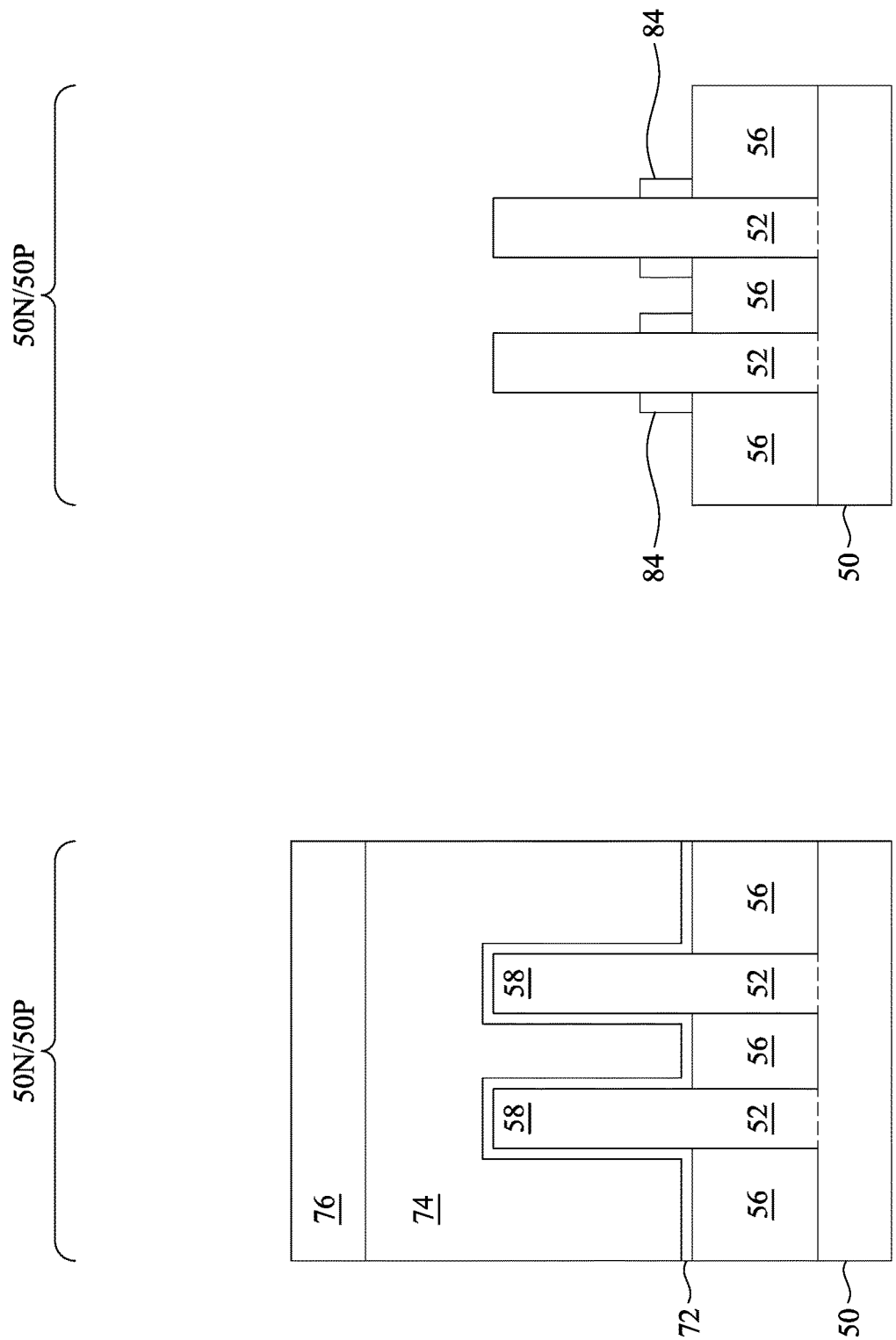
Figure 6C:
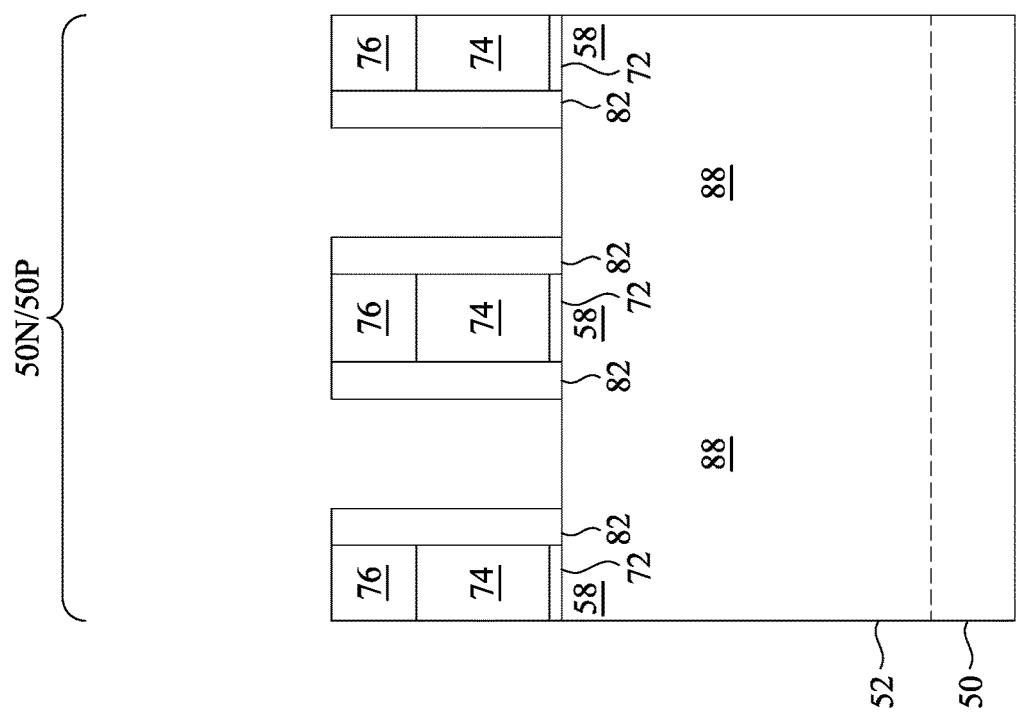

In FIGS. 6A-6C, gate spacers 82 are formed over the fins 52, on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82, see FIG. 6C). In some embodiments the etch used to form the gate spacers 82 is adjusted so that the dielectric material(s), when etched, also have portions left on the sidewalls of the fins 52 (thus forming fin spacers 84, see FIG. 6B). After etching, the fin spacers 84 (if present) and the gate spacers 82 can have straight sidewalls (as illustrated) or can have rounded sidewalls (not separately illustrated).

Further, implants may be performed to form lightly doped source/drain (LDD) regions (not separately illustrated) in the fins 52. In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using a different structures and steps.

Figure 7C:
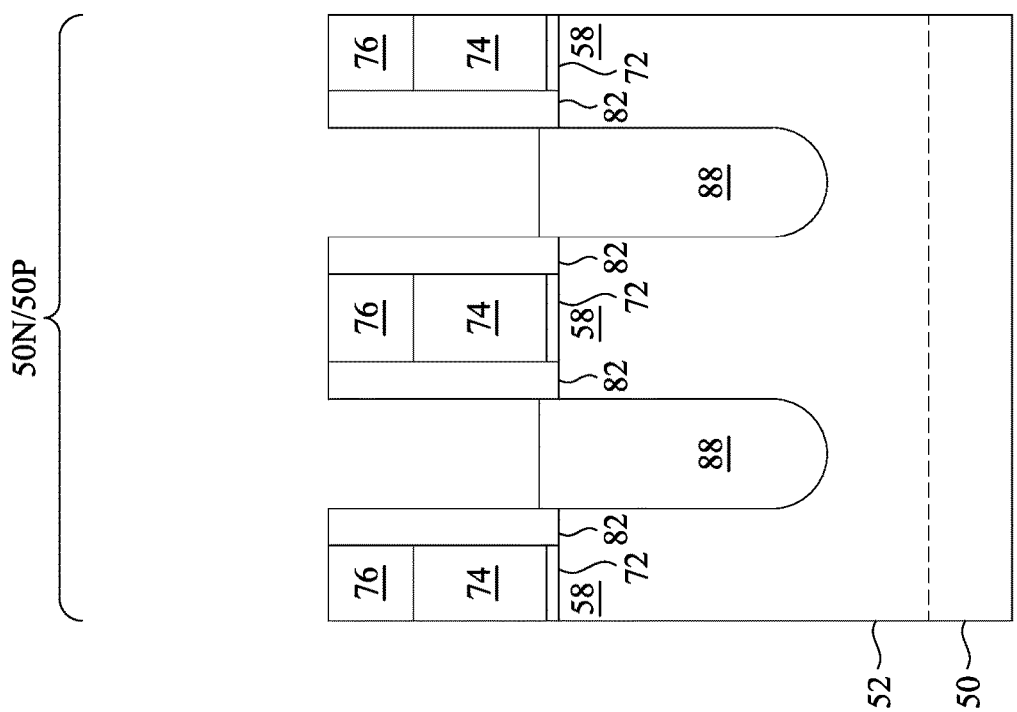

In FIGS. 7A-7C, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous-doped silicon, phosphorous-doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron-doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming lightly-doped source/drain regions, followed by an anneal. The source/drain regions may have an impurity concentration of between $10^{19}$ cm$^{-3}$ and $10^{21}$ cm$^{-3}$. The n-type and/or p-type impurities for source/drain regions may be any of the impurities previously discussed. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7B. In some embodiments, adjacent epitaxial source/drain regions 88 remain separated after the epitaxy process is completed (not separately illustrated). In the illustrated embodiments, fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

Figure 8B:
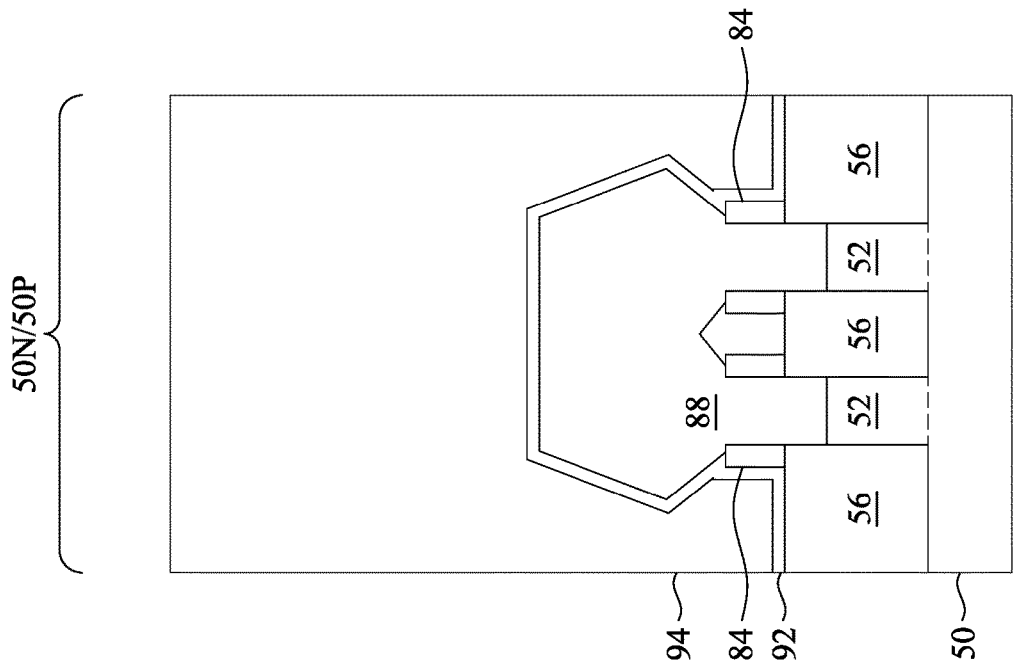
Figure 8A:
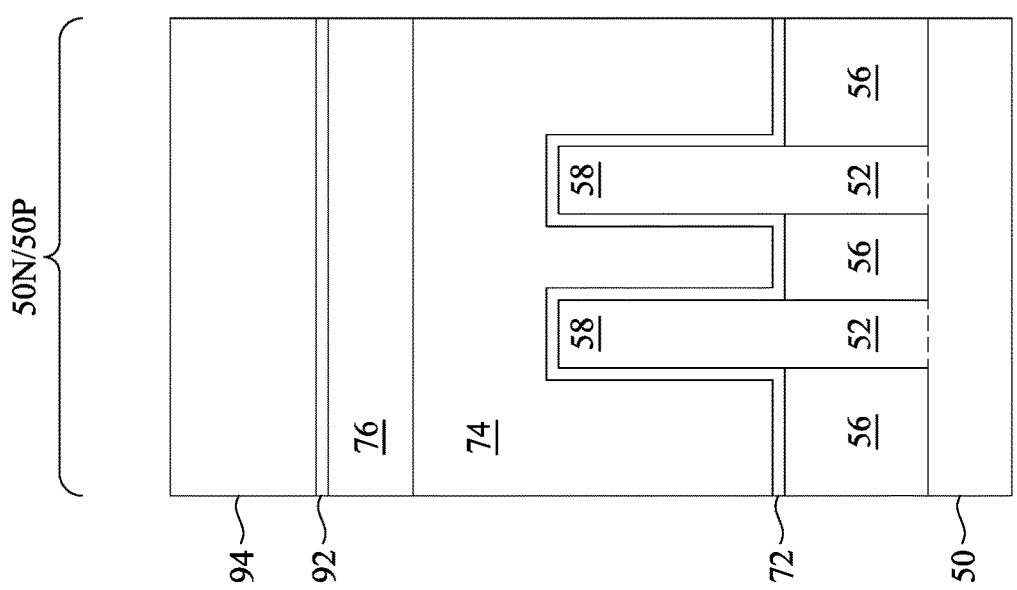
Figure 8C:
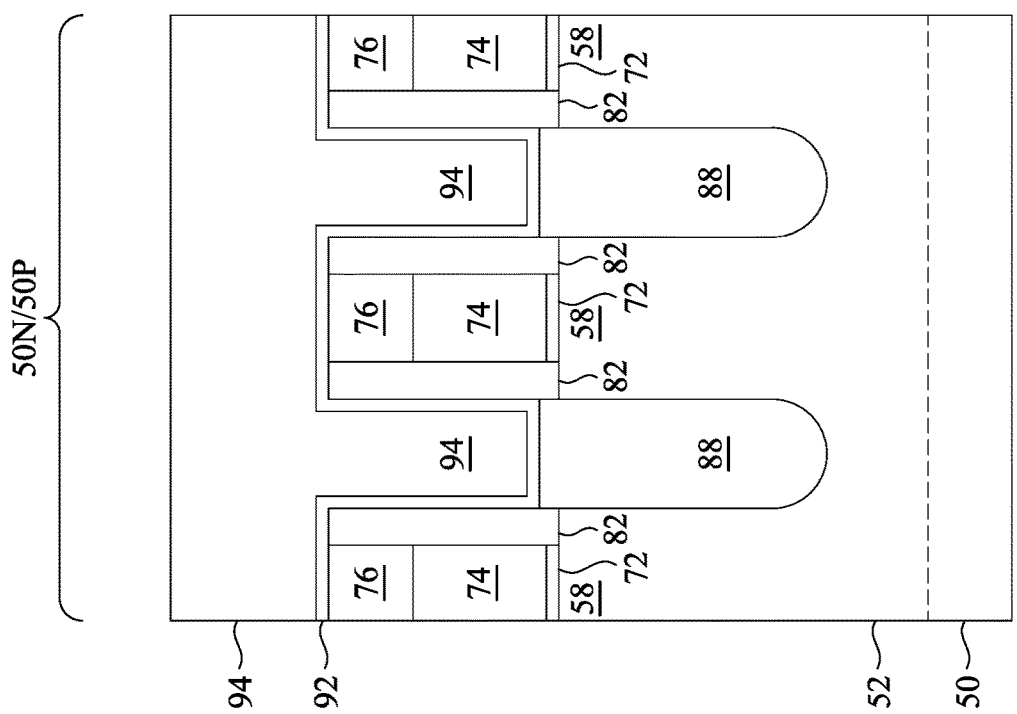

In FIGS. 8A-8C, a first ILD 94 is deposited over the epitaxial source/drain regions 88, the gate spacers 82, the masks 76 (if present) or the dummy gates 74, and the STI regions 56. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, the masks 76 (if present) or the dummy gates 74, and the STI regions 56. The CESL 92 may be formed of a dielectric material having a high etching selectivity from the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like.

Figure 9B:
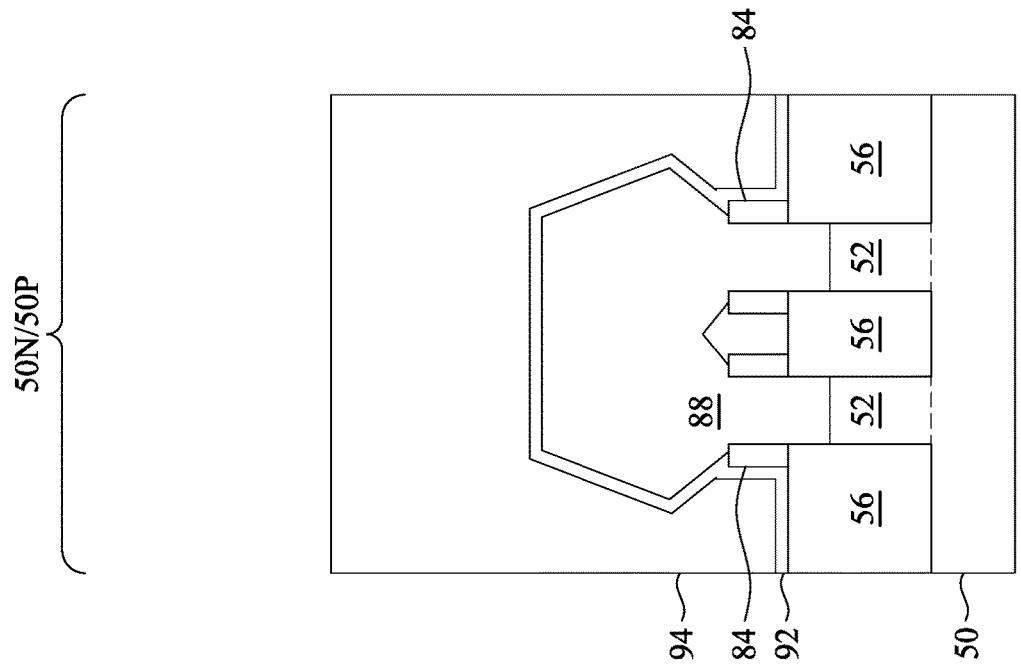
Figure 9A:
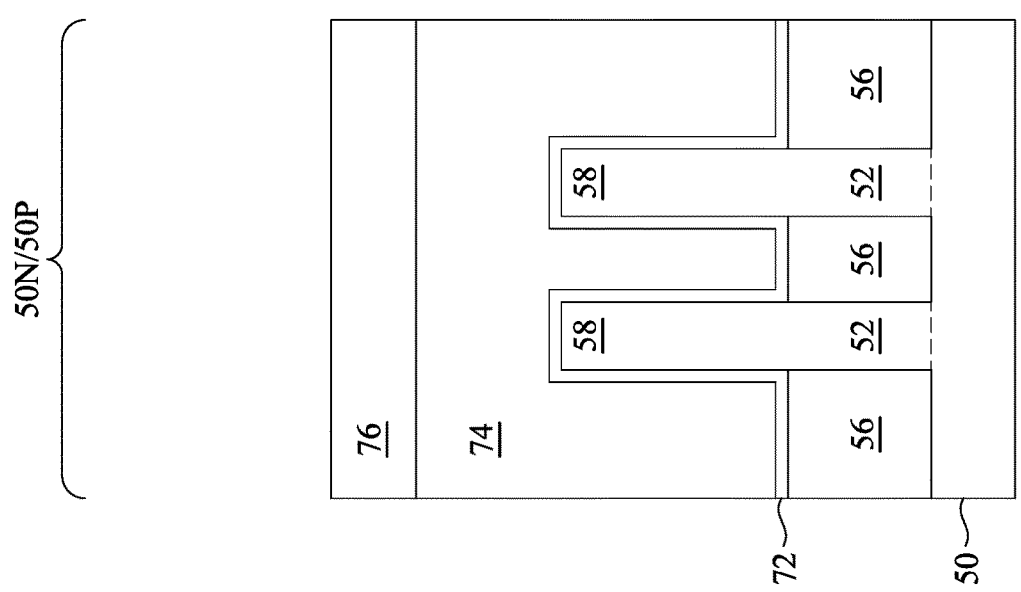
Figure 9C:
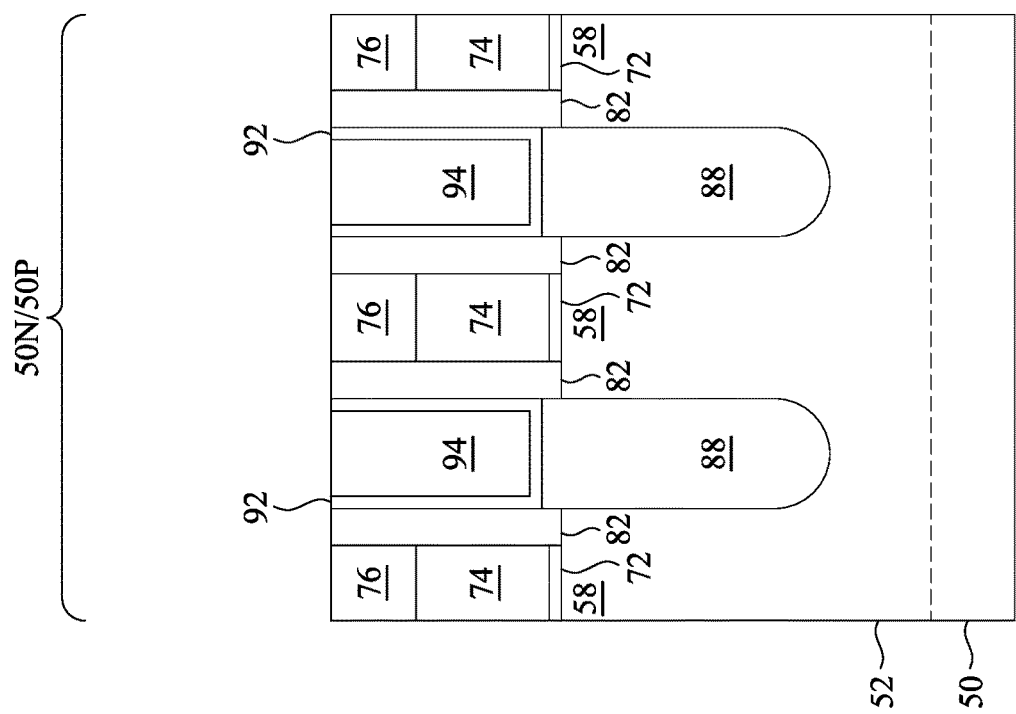

In FIGS. 9A-9C, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are substantially coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figure 10B:
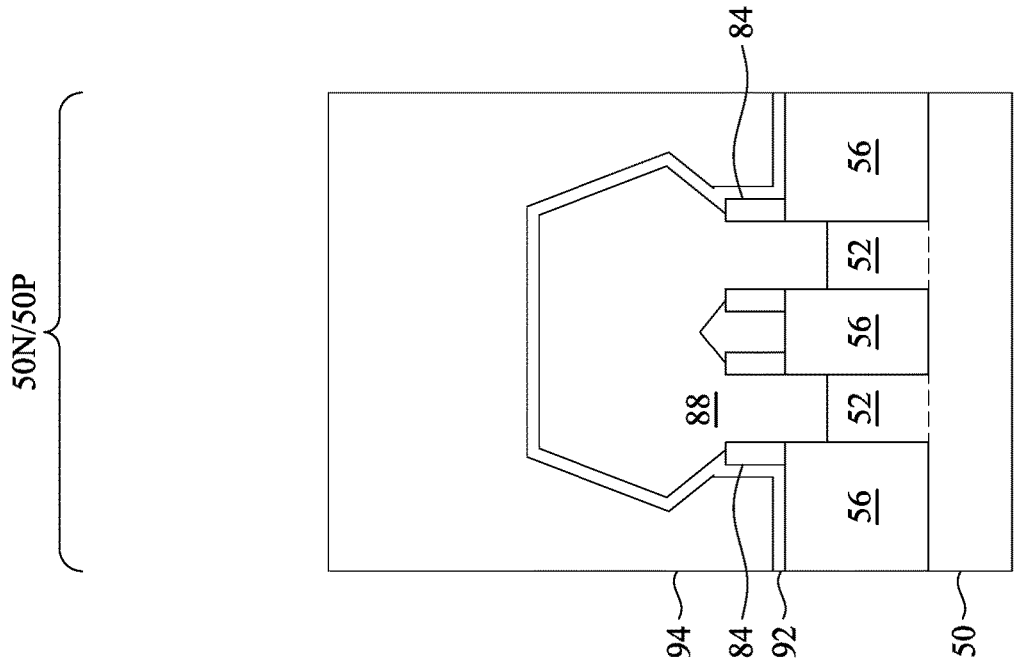
Figure 10A:
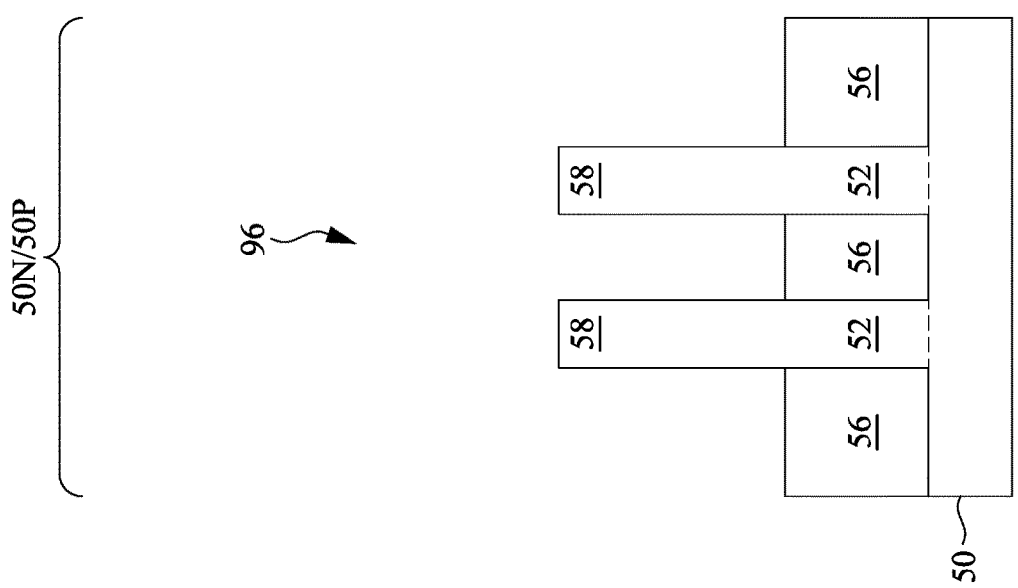

In FIGS. 10A-10C, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11B:
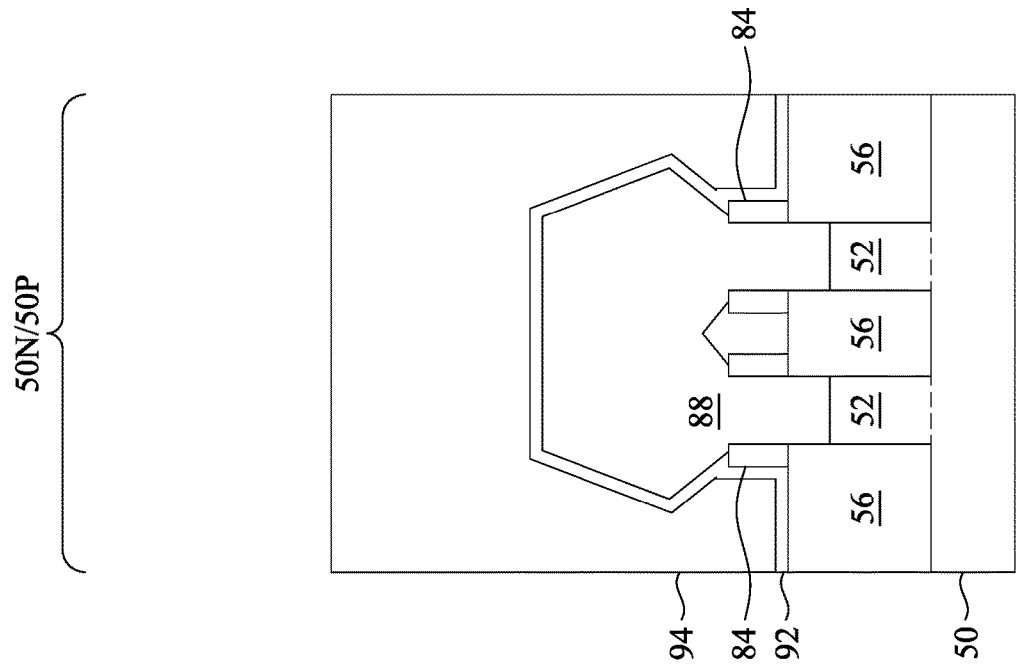
Figure 11A:
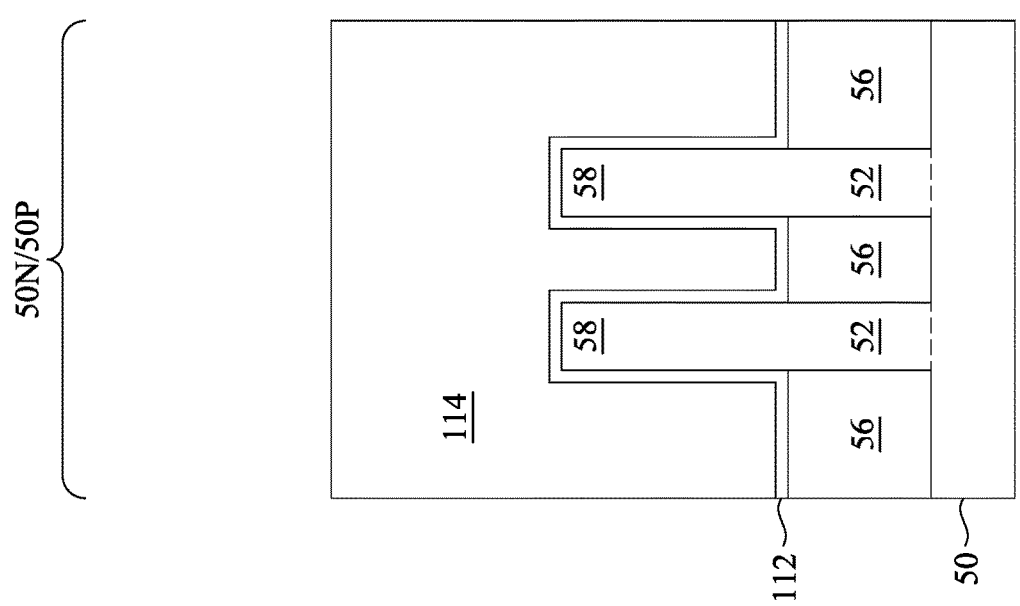
Figure 11C:
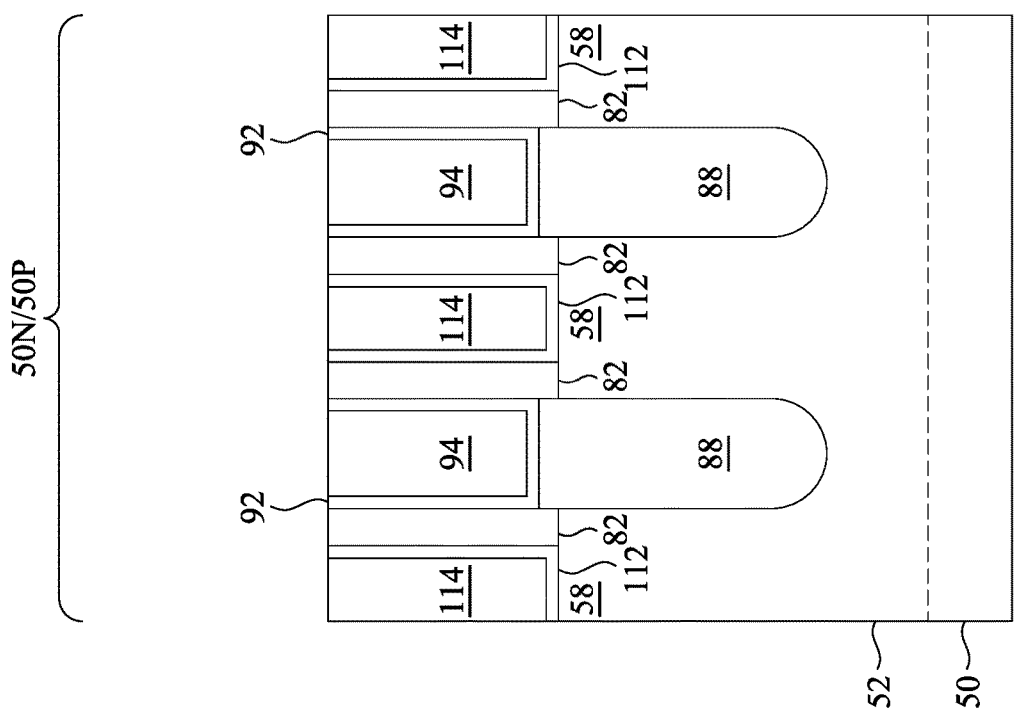

In FIGS. 11A-11C, gate dielectrics 112 and gate electrodes 114 are formed for replacement gate structures. Each respective pair of a gate dielectric 112 and a gate electrode 114 may be collectively referred to as a "gate structure." Each gate structure extends along sidewalls and a top surface of a channel region 58 of a fin 52.

The gate dielectrics 112 include one or more gate dielectric layer(s) disposed on top surfaces and the sidewalls of the fins 52, and on the sidewalls of the gate spacers 82. The gate dielectrics 112 may be formed of an oxide such as silicon oxide or a metal oxide, a silicate such as a metal silicate, combinations thereof, multi-layers thereof, or the like. Additionally or alternatively, the gate dielectrics 112 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 112 may be formed by molecular-beam deposition (MBD), ALD, PECVD, or the like. Although a single-layered gate dielectrics 112 are illustrated, the gate dielectrics 112 may include any number of interfacial layers and any number of main layers. For example, the gate dielectrics 112 may include an interfacial layer and an overlying high-k dielectric layer.

The gate electrodes 114 include one or more gate electrode layer(s) disposed over the gate dielectrics 112. The gate electrodes 114 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures, one or more gate dielectric layer(s) may be deposited in the recesses 96. The gate dielectric layer(s) may also be deposited on the top surfaces of the first ILD 94, the CESL 92, and the gate spacers 82. Subsequently, one or more gate electrode layer(s) may be deposited on the gate dielectric layer(s), and in the remaining portions of the recesses 96. A removal process may then be performed to remove the excess portions of the gate dielectric layer(s) and the gate electrode layer(s), which excess portions are over the top surfaces of the first ILD 94, the CESL 92, and the gate spacers 82. The gate dielectric layer(s), after the removal process, have portions left in the recesses 96 (thus forming the gate dielectrics 112). The gate electrode layer(s), after the removal process, have portions left in the recesses 96 (thus forming the gate electrodes 114). In some embodiments, a planarization process such as a chemical mechanical polish (CMP), an etch-back process, combinations thereof, or the like may be utilized. After the planarization process, the top surfaces of the gate spacers 82, the CESL 92, the first ILD 94, the gate dielectrics 112, and the gate electrodes 114 are substantially coplanar (within process variations).

The formation of the gate dielectrics 112 in the n-type region 50N and the p-type region 50P may occur simultaneously such that the gate dielectrics 112 in each region are formed of the same material(s), and the formation of the gate electrodes 114 may occur simultaneously such that the gate electrodes 114 in each region are formed of the same material(s). In some embodiments, the gate dielectrics 112 in each region may be formed by distinct processes, such that the gate dielectrics 112 may include different materials and/or have a different number of layers, and/or the gate electrodes 114 in each region may be formed by distinct processes, such that the gate electrodes 114 may include different materials and/or have a different number of layers. Various masking steps may be used to mask and expose appropriate regions when using distinct processes.

Figure 12B:
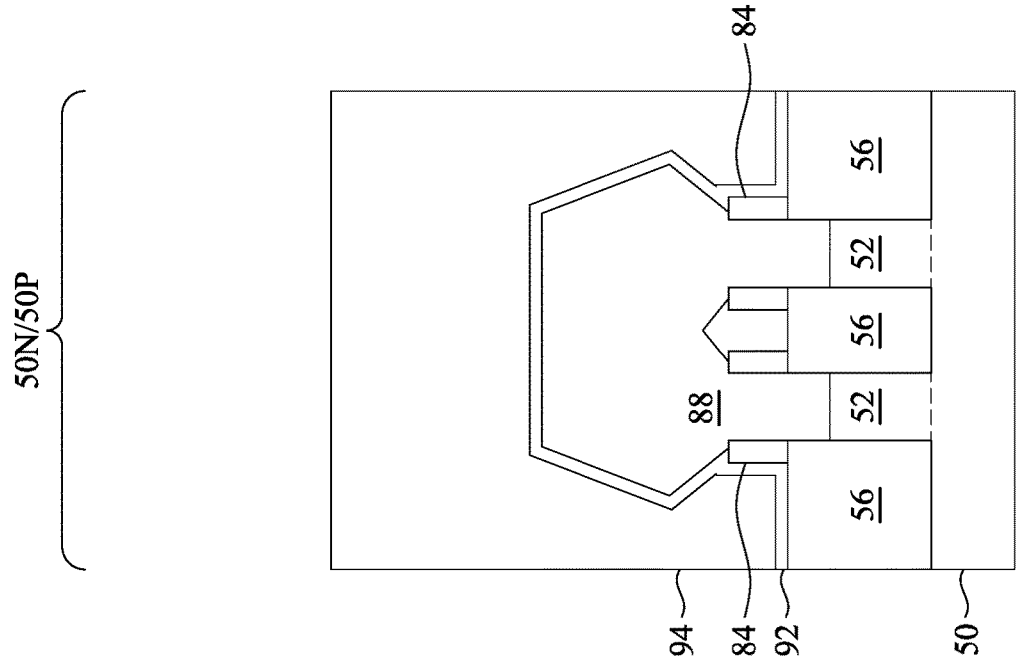
Figure 12A:
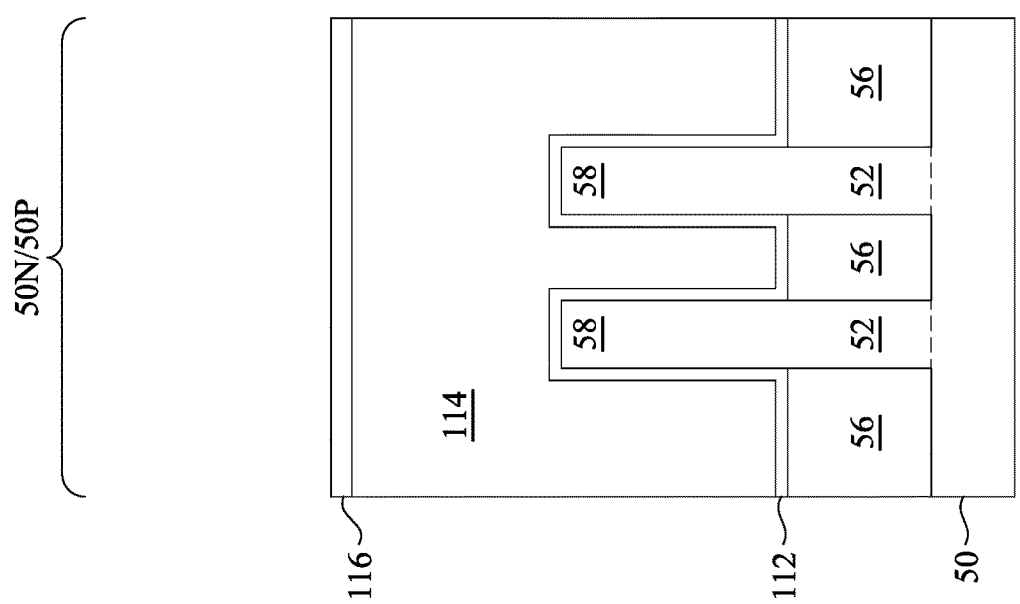
Figure 12C:
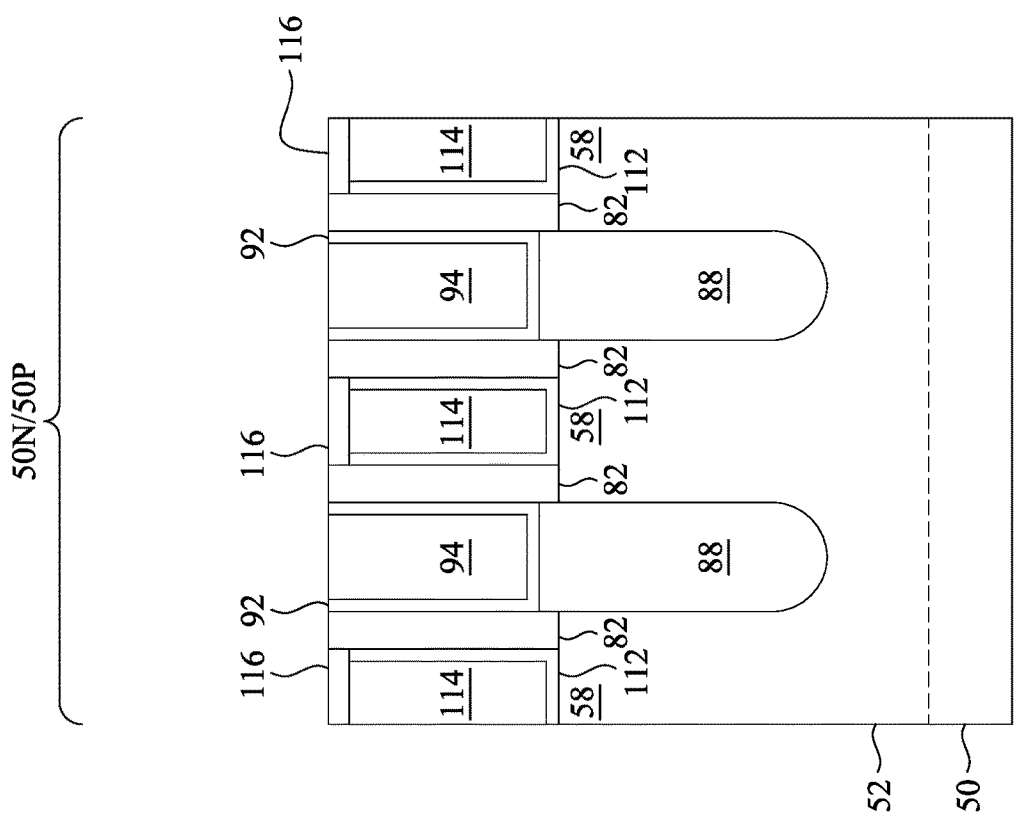

In FIGS. 12A-12C, gate masks 116 are formed over the gate structures (including the gate dielectrics 112 and the gate electrodes 114). In some embodiments, the gate masks 116 may also be formed over the gate spacers 82. Gate contacts will be subsequently formed to penetrate through the gate masks 116 to contact the top surfaces of the gate electrodes 114.

As an example to form the gate masks 116, the gate structures (including the gate dielectrics 112 and the gate electrodes 114) may be recessed using any acceptable etching process. In some embodiments (not separately illustrated), the gate spacers 82 are also recessed. Dielectric material(s) are then conformally deposited in the recesses. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. A removal process is performed to remove the excess portions of the dielectric material(s), which excess portions are over the top surfaces of the first ILD 94, thereby forming the gate masks 116. In some embodiments, a planarization process such as a chemical mechanical polish (CMP), an etch-back process, combinations thereof, or the like may be utilized. The dielectric material(s), when planarized, have portions left in the recesses (thus forming the gate masks 116). After the planarization process, the top surfaces of the gate spacers 82, the CESL 92, the first ILD 94, and the gate masks 116 are substantially coplanar (within process variations).

Figure 13B:
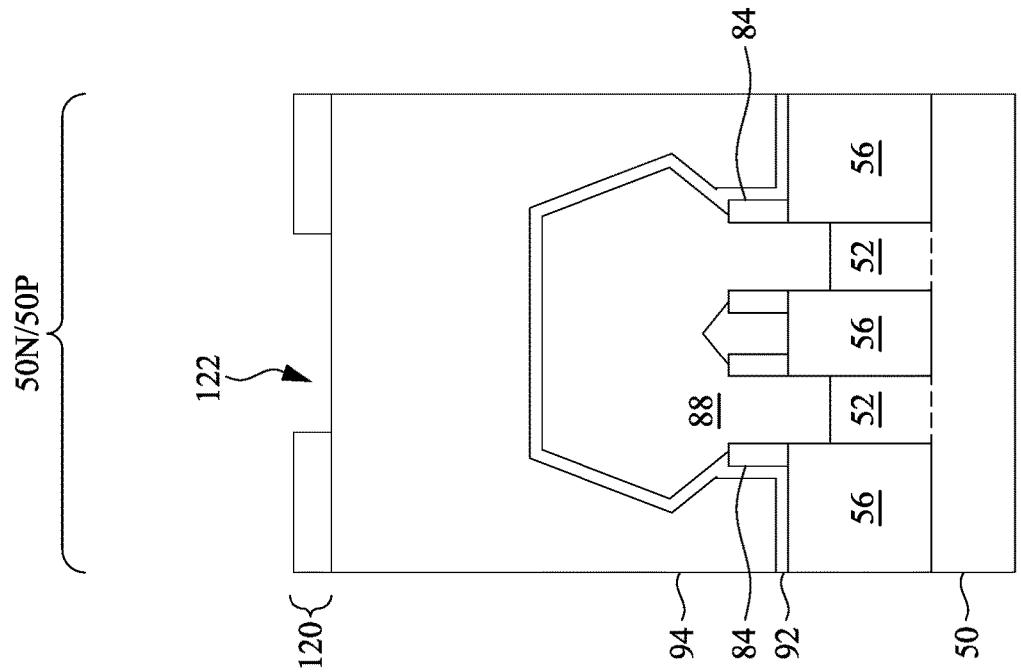
Figure 13A:
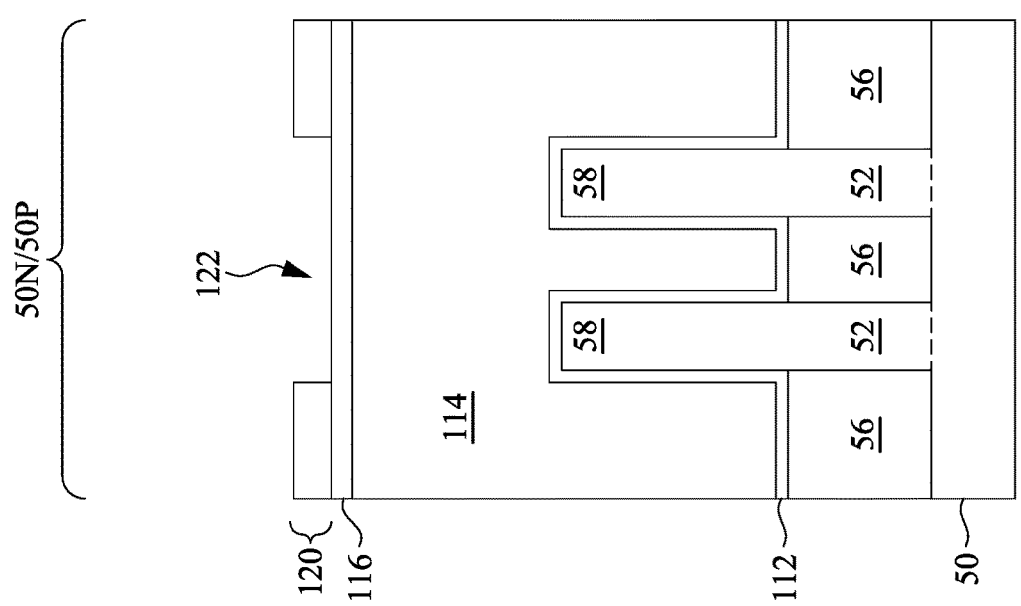
Figure 13C:
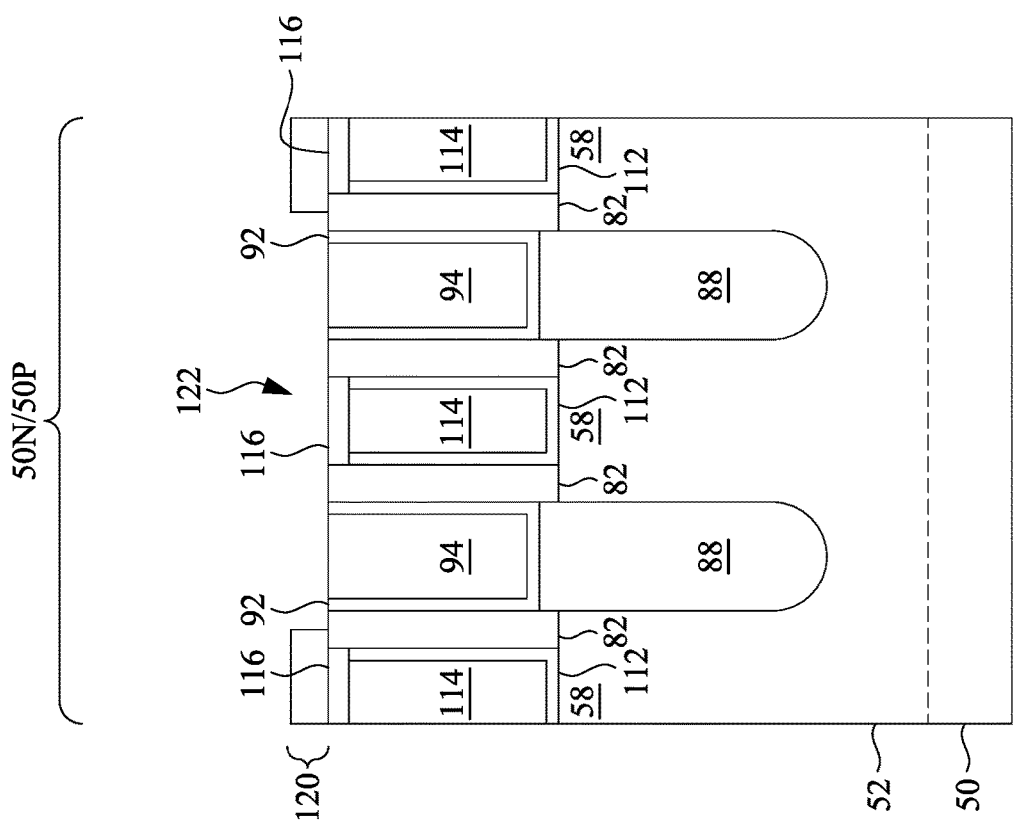

In FIGS. 13A-13C, a mask 120 is formed over the gate spacers 82, the CESL 92, the first ILD 94, and the gate masks 116. The mask 120 may be formed by forming one or more masking layer(s) and then patterning the masking layer(s) with openings 122. The masking layer(s) can be any acceptable photoresist that includes a photosensitive material, such as a single-layer photoresist, a bi-layer photoresist, a tri-layer photoresist, or the like. In some embodiments, a tri-layer photoresist including a bottom layer (e.g., a bottom anti-reflective coating (BARC) layer), a middle layer (e.g., a nitride, an oxide, an oxynitride, or the like), and a top layer (e.g., a photosensitive material) is utilized. The masking layer(s) may be formed by spin coating, a deposition process such as CVD, combinations thereof, or the like. The masking layer(s) may be patterned with the openings 122 using acceptable photolithography and etching techniques to form the mask 120. The openings 122 are slot openings that run parallel to the lengthwise directions of the fins 52, overlapping the CESL 92, the first ILD 94, and the gate masks 116. In some embodiments, the openings 122 extend over multiple epitaxial source/drain regions 88 and/or multiple gate structures (including the gate dielectrics 112 and the gate electrodes 114).

Figure 14B:
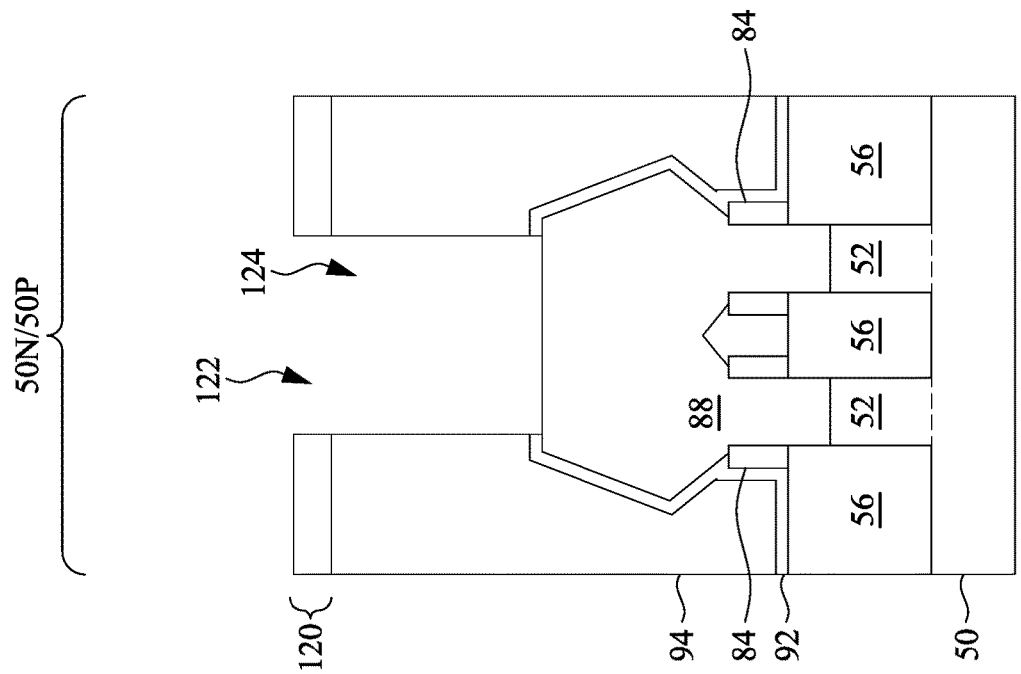
Figure 14A:
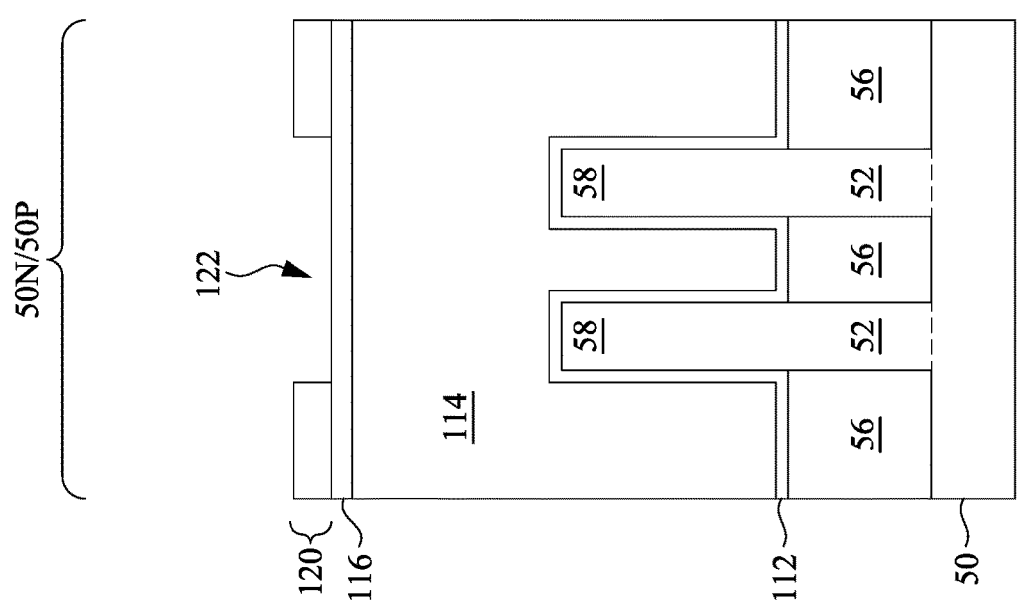
Figure 14C:
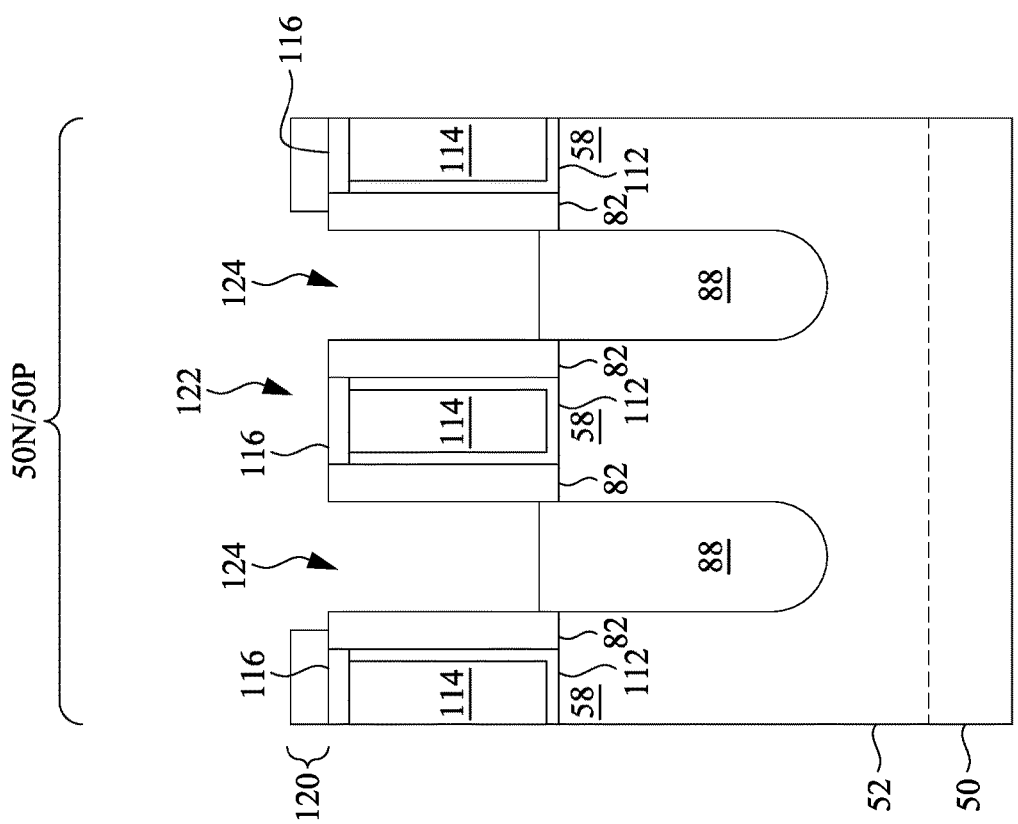

In FIGS. 14A-14C, the first ILD 94 is etched using the mask 120 as an etching mask and using the CESL 92 as an etch stop layer to form contact openings 124 for source/drain contacts. The etching may be any acceptable etching process, such as one that is selective to the material of the first ILD 94 (e.g., selectively etches the material of the first ILD 94 at a faster rate than the material(s) of the gate spacers 82, the CESL 92, and the gate masks 116). The etching process may be anisotropic. The contact openings 124 are then extended through the CESL 92 by any acceptable etching process to expose the epitaxial source/drain regions 88. The gate masks 116 cover the gate structures (including the gate dielectrics 112 and the gate electrodes 114) during etching, thereby protecting the gate structures during the etching of the contact openings 124. The etching process for forming the contact openings 124 is a self-aligned contact (SAC) etching process, in which the gate spacers 82, the CESL 92, and the gate masks 116 are exposed to etchants during the etching of the contact openings 124. After the etching processes, the mask 120 may be removed, such as by any acceptable ashing process.

Figure 15B:
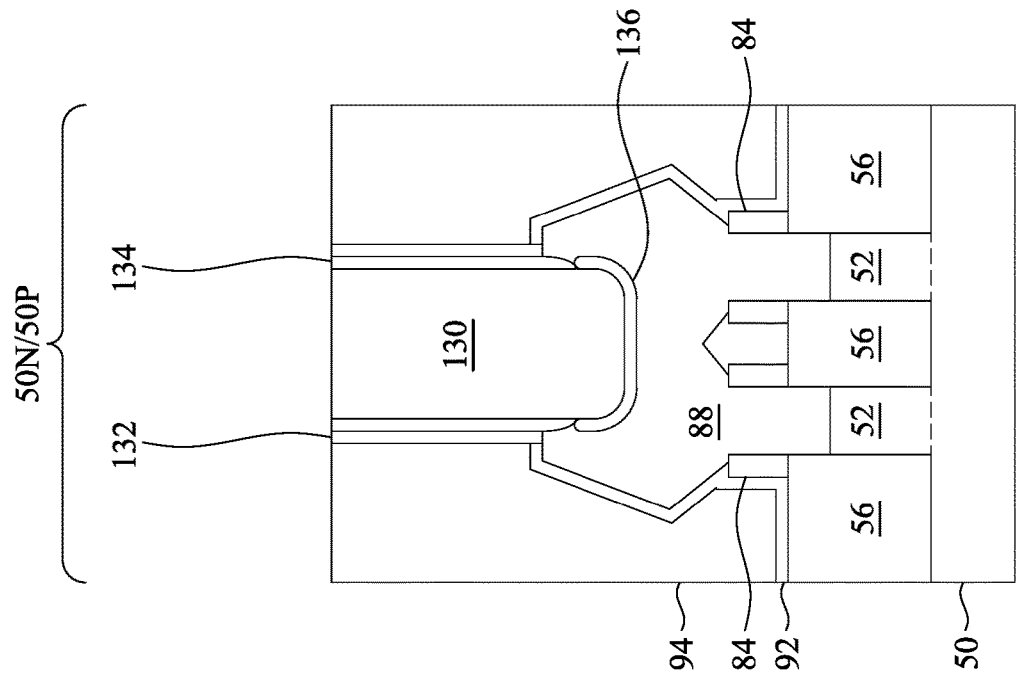
Figure 15A:
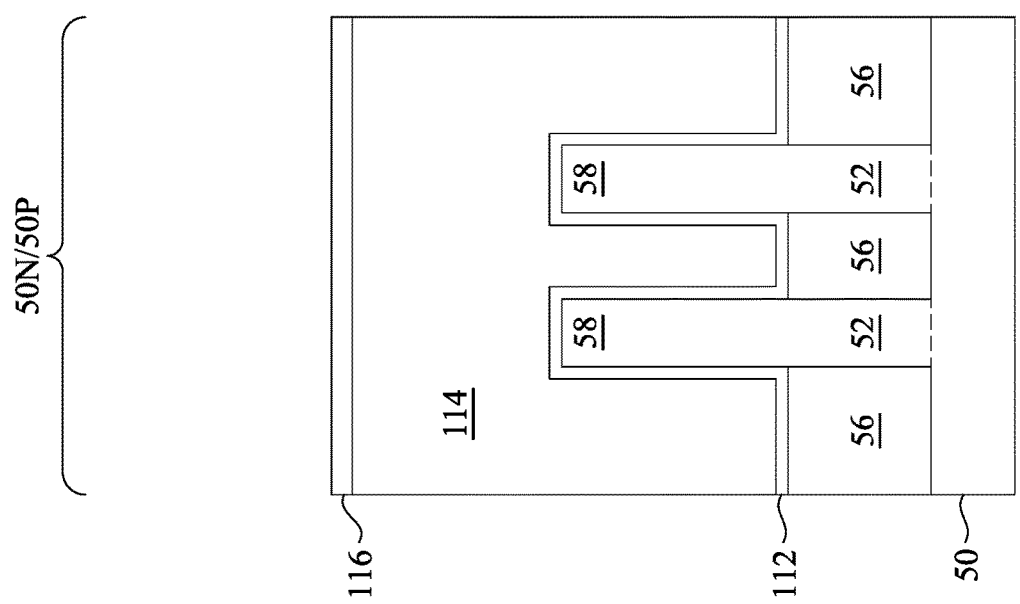
Figure 15C:
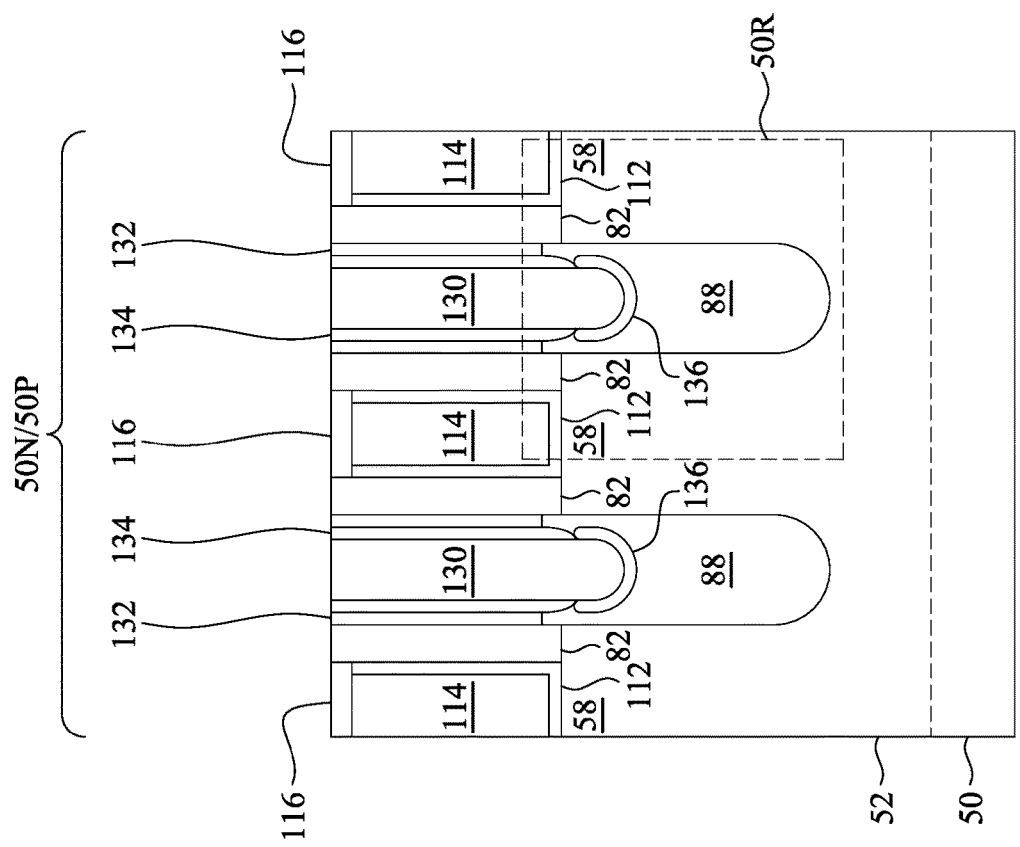

In FIGS. 15A-15C, source/drain contacts 130 are formed in the contact openings 124. The source/drain contacts 130 are physically and electrically coupled to the epitaxial source/drain regions 88. One or more spacers, such as contact spacers 132 and contact spacers 134 are formed around the source/drain contacts 130 in the contact openings 124. Each of the contact spacers 132, 134 may be ring-shaped in a top-down view. Metal-semiconductor alloy regions 136 are formed at the interfaces between the epitaxial source/drain regions 88 and the source/drain contacts 130.

FIGS. 16-23 illustrate the formation of the source/drain contacts 130, the contact spacers 132, 134, and the metal-semiconductor alloy regions 136. Processing steps in a region 50R of FIG. 15C are shown. During formation of the source/drain contacts 130, recesses 144 (see FIG. 19) for the source/drain contacts 130 are formed in the epitaxial source/drain regions 88, so that the source/drain contacts 130 may be formed to extend into the epitaxial source/drain regions 88 (e.g., beneath the top surfaces of the epitaxial source/drain regions 88). Doing so increases the contact area to the epitaxial source/drain regions 88, which may reduce the contact resistance to the epitaxial source/drain regions 88. After formation of the recesses 144, an implantation process is performed to increase a dopant concentration in the portions of the epitaxial source/drain regions 88 at the bottoms of the recesses 144. The implantation process utilize a pre-amorphous implant (PAI), which helps increase the dopant concentration and dopant activation level in the desired portions of the epitaxial source/drain regions 88. The metal-semiconductor alloy regions 136 are then formed on the portions of the epitaxial source/drain regions 88 that have a high dopant concentration in the recesses 144. As a result, the metal-semiconductor alloy regions 136 have a high dopant concentration. Forming the metal-semiconductor alloy regions 136 with a high dopant concentration may help reduce the contact resistance to the epitaxial source/drain regions 88.

One or more of the processes described for FIGS. 16-23 may be performed in one of the regions 50N, 50P, and then repeated in the other of the regions 50N, 50P. For example, the subsequently described implantation processes may be performed once in the n-type region 50N and again in the p-type region 50P. Various masking steps may be used to mask and expose appropriate regions during the implantation processes.

Figure 16:
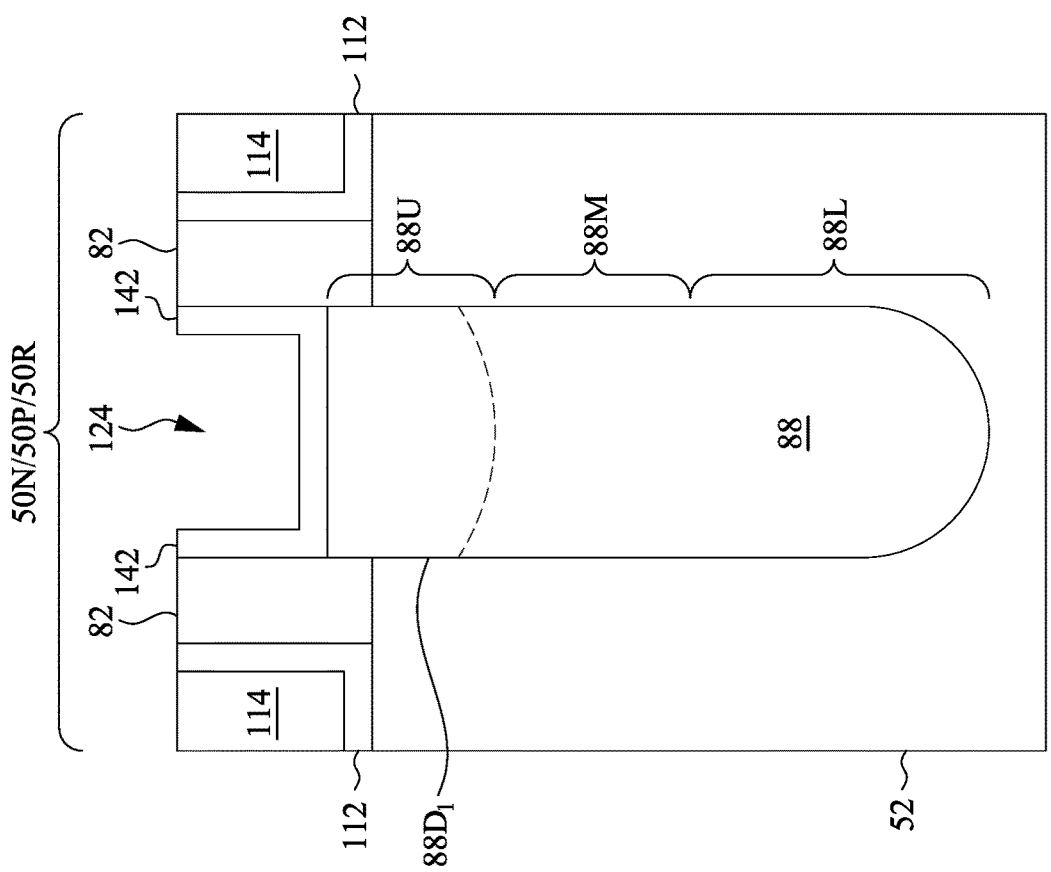

In FIG. 16, a spacer layer 142 is formed in the contact openings 124. The spacer layer 142 may be formed of a dielectric material using a conformal deposition process, such that the spacer layer 142 is deposited on the top surfaces of the epitaxial source/drain regions 88 and the sidewalls of the gate spacers 82. Although not separately illustrated, the spacer layer 142 may also be deposited on the top surfaces of the gate spacers 82 and the gate masks 116 (see FIG. 15C). Acceptable dielectric materials may include silicon nitride, silicon carbonitride, silicon oxynitride, silicon oxycarbonitride, aluminum oxide, or the like, which may be formed by chemical vapor deposition (CVD), atomic layer deposition (ALD), or the like.

Following or prior to forming the spacer layer 142, a first implantation process is performed to implant a dopant in the upper portions 88U of the epitaxial source/drain regions 88, thereby increasing the dopant concentration of the upper portions 88U of the epitaxial source/drain regions 88 and forming first highly-doped regions $88D_1$. Metal-semiconductor alloy regions will subsequently be formed in/on the first highly-doped regions $88D_1$. The dopant implanted to form the first highly-doped regions $88D_1$ has the same conductivity type as the epitaxial source/drain regions 88. Specifically, n-type dopants are implanted in the epitaxial source/drain regions 88 in the n-type region 50N, and p-type dopants are implanted in the epitaxial source/drain regions 88 in the p-type region 50P. Acceptable n-type dopants include phosphorous, arsenic, tin, and the like. Acceptable p-type dopants include boron, boron fluoride ($BF_2$), gallium, and the like.

The first implantation process is performed with a low implantation energy so that the implantation is shallow. In some embodiments, the implantation energy of the first implantation process may be in the range of 1 keV to 50 keV, which allows for a shallow implantation. As a result, the first implantation process results in the upper portions 88U of the epitaxial source/drain regions 88 being implanted to include the dopant therein, while the lower portions 88L of the epitaxial source/drain regions 88 are not implanted. Implanting the dopant in the upper portions 88U but not the lower portions 88L of the epitaxial source/drain regions 88 helps reduce device leakage. The implantation dosage may be in the range of 5 E13 $cm^{-2}$ to 1 E16 $cm^{-2}$. The implantation may be vertical or tilted, and the tilt angle may be smaller than 60 degrees. During the implantation, the temperature of the substrate 50 may be controlled to be in the range of −100° C. to 500° C. In some embodiments, the first highly-doped regions $88D_1$ have a dopant concentration in the range of 1 E20 $cm^{-3}$ to 1 E22 $cm^{-3}$.

Figure 17:
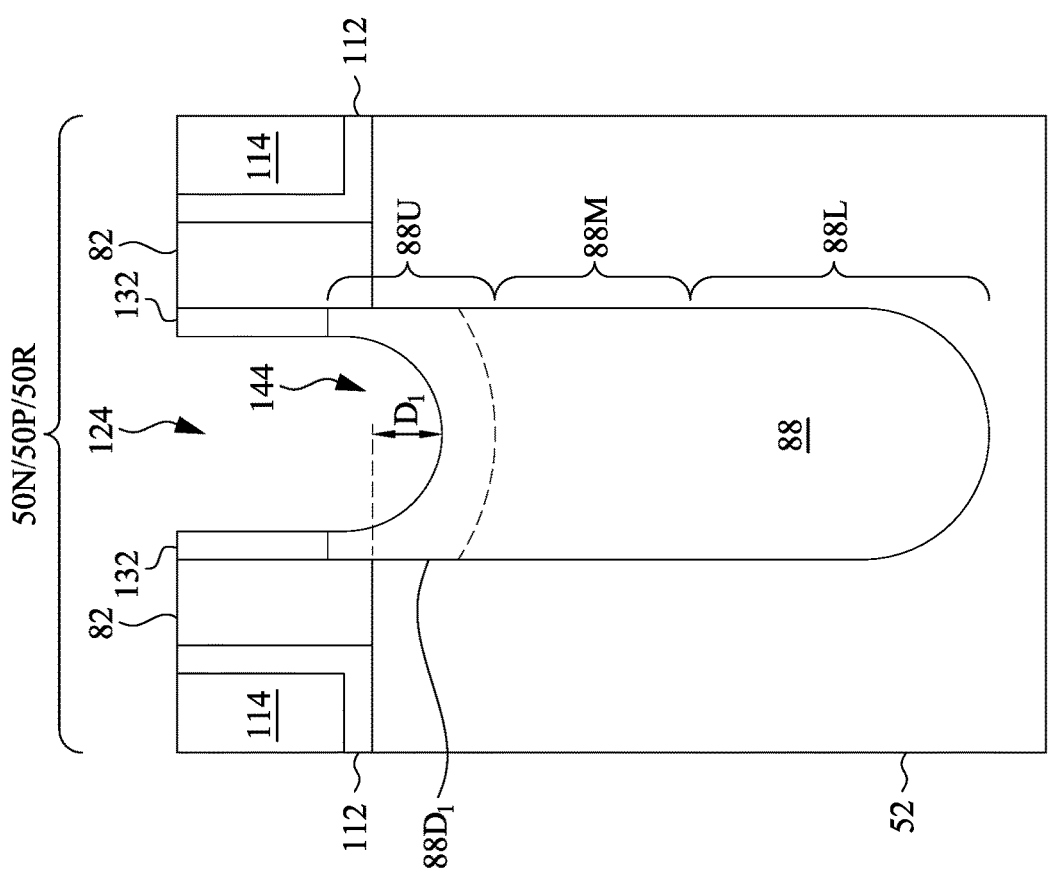

In FIG. 17, the spacer layer 142 is patterned to form contact spacers 132. The spacer layer 142 may be patterned by etching the spacer layer 142 to remove horizontal portions of the spacer layer 142. Any acceptable etch process, such as a dry etch, a wet etch, the like, or a combination thereof, may be performed to pattern the spacer layer 142. The etching may be anisotropic. The spacer layer 142, when etched, has vertical portions left on the sidewalls of the gate spacers 82 (thus forming the contact spacers 132).

The spacer layer 142 is over-etched, so that recesses 144 are formed extending into the epitaxial source/drain regions 88. The contact spacers 132 may help protect the lateral areas of the upper portions 88U of the epitaxial source/drain regions 88 to reduce losses of the first highly-doped regions $88D_1$ when etching the epitaxial source/drain regions 88. Source/drain contacts will subsequently be formed in the recesses 144. Forming the recesses 144 increases the contact area to the epitaxial source/drain regions 88, which may reduce the contact resistance to the epitaxial source/drain regions 88. In some embodiments, after forming the recesses 144, a distance $D_1$ between the top surfaces of the fins 52 and the bottoms of the recesses 144 is in the range of 5 nm to 6 nm. After initially forming the recesses 144, the depth of the recesses 144 is less than the height of the first highly-doped regions $88D_1$. Timed etch processes may be used to stop the etching of the recesses 144 after the recesses 144 reach a desired depth.

Figure 18:
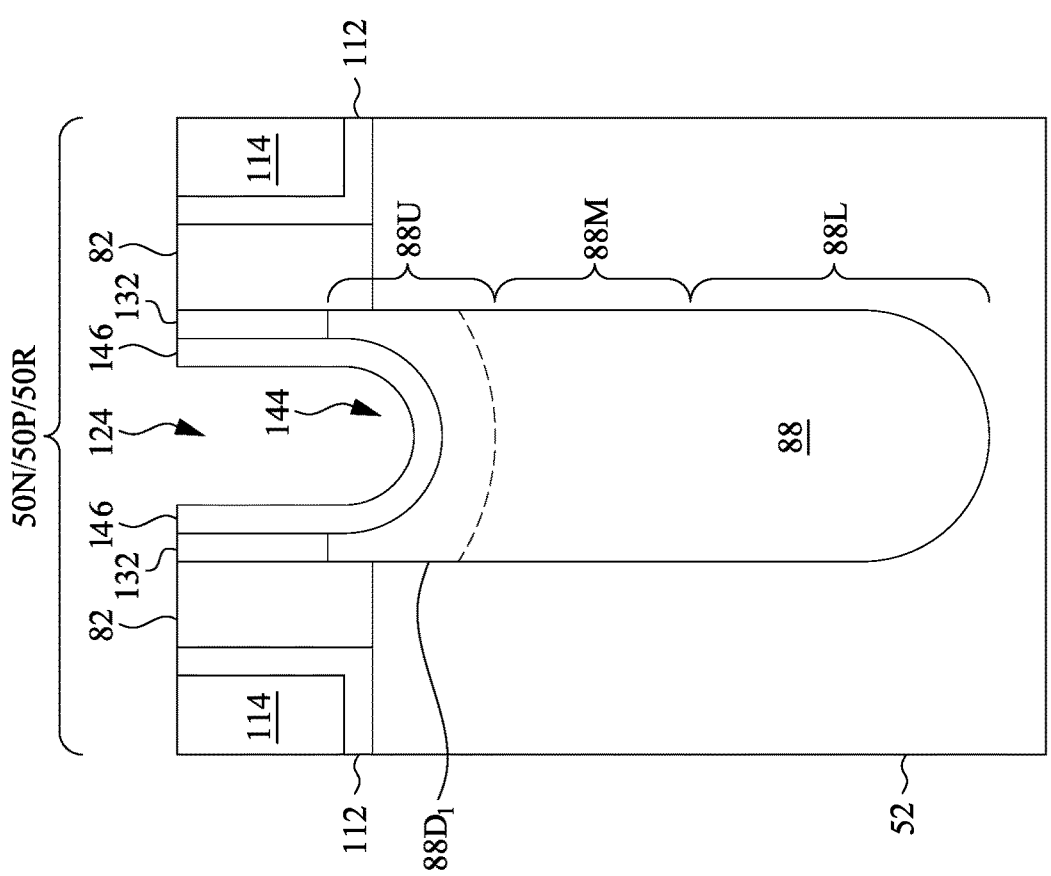

In FIG. 18, a spacer layer 146 is formed in the contact openings 124 and in the recesses 144. The spacer layer 146 may formed of a dielectric material using a conformal deposition process, such that the spacer layer 146 is deposited on the top surfaces of the epitaxial source/drain regions 88 and the sidewalls of the contact spacers 132. Although not separately illustrated, the spacer layer 146 may also be deposited on the top surfaces of the contact spacers 132, the gate spacers 82, and the gate masks 116 (see FIG. 15C). Acceptable dielectric materials may include silicon nitride, silicon carbonitride, silicon oxynitride, silicon oxycarbonitride, aluminum oxide, or the like, which may be formed by chemical vapor deposition (CVD), atomic layer deposition (ALD), or the like.

Figure 19:
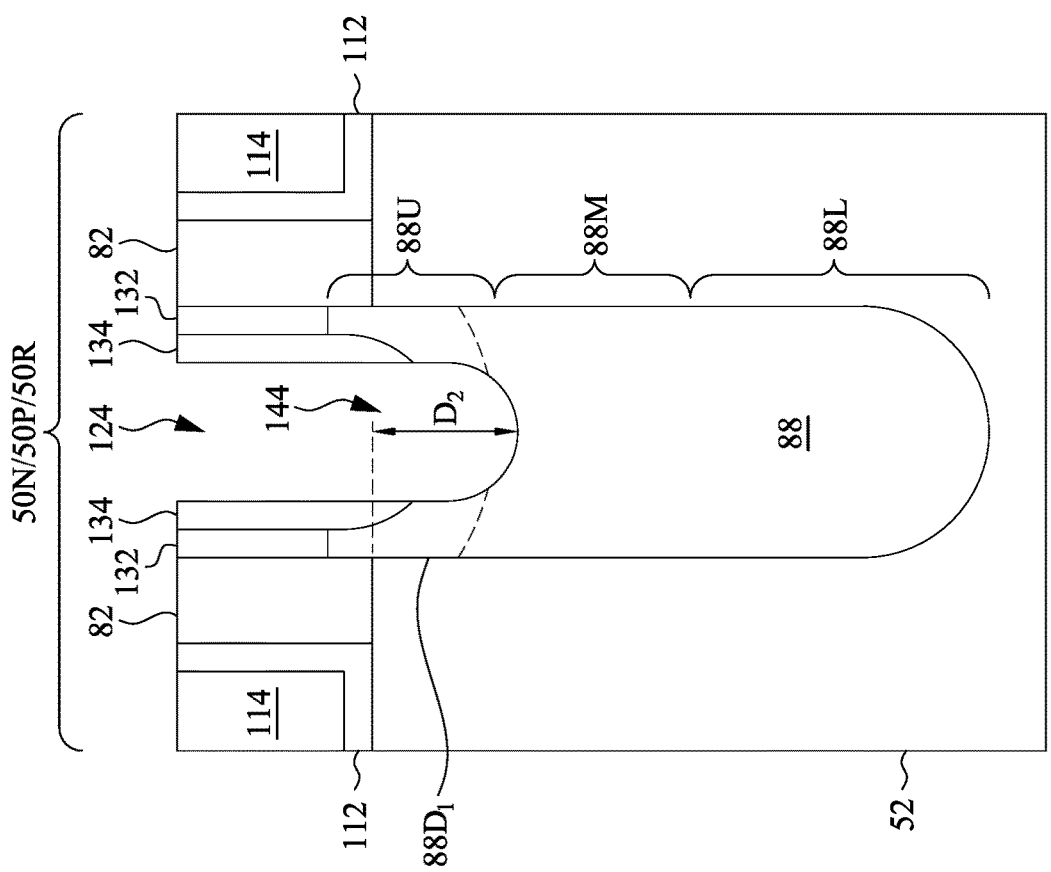

In FIG. 19, the spacer layer 146 is patterned to form contact spacers 134. The spacer layer 146 may be patterned by etching the spacer layer 146 to remove horizontal portions of the spacer layer 146. Any acceptable etch process, such as a dry etch, a wet etch, the like, or a combination thereof, may be performed to pattern the spacer layer 146. The etching may be anisotropic. The spacer layer 146, when etched, has vertical portions left on the sidewalls of the contact spacers 132 and the epitaxial source/drain regions 88 (thus forming the contact spacers 134).

The spacer layer 146 is over-etched, so that the recesses 144 are extended further into the epitaxial source/drain regions 88. The contact spacers 132, 134 may help protect the lateral areas of the upper portions 88U of the epitaxial source/drain regions 88 to reduce losses of the first highly-doped regions $88D_1$ when etching the epitaxial source/drain regions 88. Extending the recesses 144 further increases the contact area to the epitaxial source/drain regions 88, which may further reduce the contact resistance to the epitaxial source/drain regions 88. In some embodiments, after extending the recesses 144, a distance $D_2$ between the top surfaces of the fins 52 and the bottoms of the recesses 144 is in the range of 9 nm to 10 nm. After extending the recesses 144, the depth of the recesses 144 is greater than the height of the first highly-doped regions $88D_1$. Timed etch processes may be used to stop the etching of the recesses 144 after the recesses 144 are extended to a desired depth.

As previously noted, source/drain contacts will subsequently be formed in the recesses 144. Extending the recesses 144 advantageously increases their depth, which allows for a large contact area to the epitaxial source/drain regions 88. However, as also previously noted, the first implantation process (described for FIG. 16) is performed with a low implantation energy to reduce device leakage. As a result, the depth of the recesses 144 is greater than the height of the first highly-doped regions $88D_1$. Therefore, the upper surfaces of the recesses 144 are defined by the first highly-doped regions $88D_1$, but the lower surfaces of the recesses 144 are defined by portions of the epitaxial source/drain regions 88 that have a lower dopant concentration than the first highly-doped regions $88D_1$. As will be subsequently described in greater detail, a second implantation process (described for FIG. 21) will be performed to implant a dopant in the portions of the epitaxial source/drain regions 88 at the bottoms of the recesses 144, thereby forming second highly-doped regions that define the lower surfaces of the recesses 144. Advantageously, this allows a substantial portion of the surfaces of the recesses 144 to be defined by highly-doped regions. Metal-semiconductor alloy regions will subsequently be formed in the recesses 144, and increasing the amount of highly-doped regions in the recesses 144 increases the dopant concentration of the metal-semiconductor alloy regions, which can reduce the contact resistance to the epitaxial source/drain regions 88.

Figure 20:
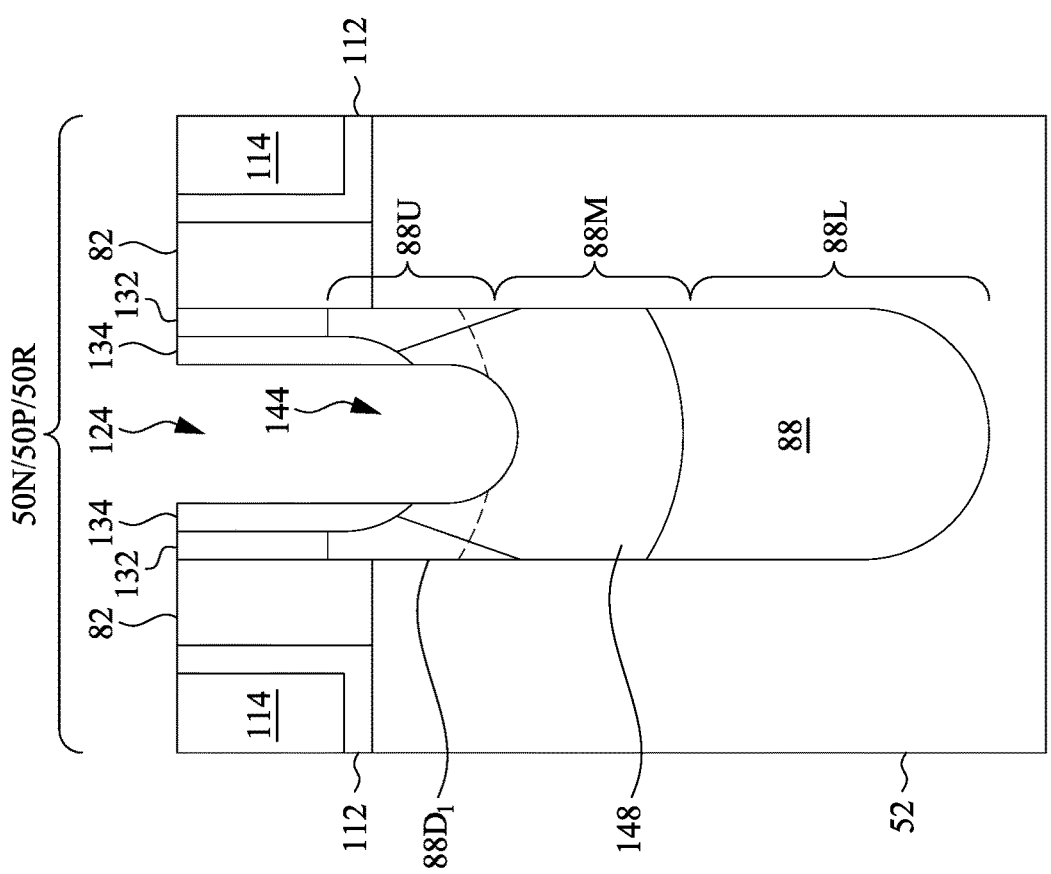

In FIG. 20, a PAI is performed to form amorphous regions 148 in the epitaxial source/drain regions 88. The PAI may be performed by implanting an amorphizing impurity in the portions of the epitaxial source/drain regions 88 that define the recesses 144. The amorphizing impurity may be an impurity having a large atomic mass, which allows for destruction of the lattice structure of the epitaxial source/drain regions 88. For example, the amorphizing impurity may be an impurity having an atomic mass greater than 28, although another atomic mass may be utilized. Acceptable amorphizing impurities include germanium, xenon, argon, silicon, and the like. The amorphizing impurity may be different from the n-type and p-type dopants utilized in prior and subsequent implantations. Other amorphizing impurities may also be utilized. For example, the amorphizing impurity may be an n-type or p-type dopant, such as arsenic, phosphorous ($P_2$), and the like. Implanting the amorphizing impurity destroys the lattice structure of the implanted portions of the epitaxial source/drain regions 88, thereby amorphizing those portions of the epitaxial source/drain regions 88 to form amorphous regions 148.

The PAI is performed with a low implantation energy so that the amorphous regions 148 are shallow. Specifically, the upper portions 88U and the middle portions 88M of the epitaxial source/drain regions 88 exposed by the recesses 144 are amorphized to form amorphous regions 148, but the lower portions 88L of the epitaxial source/drain regions 88 are not amorphized. In some embodiments, the implantation energy of the PAI may be in the range of 1 keV to 50 keV. The implantation dosage may be in the range of 5 E13 $cm^{-2}$ to 1 E16 $cm^{-2}$. The implantation may be vertical or tilted, and the tilt angle may be smaller than 60 degrees. During the implantation, the temperature of the substrate 50 may be controlled to be in the range of −100° C. to 500° C.

The contact spacers 134 may be damaged by the PAI (as illustrated with cross hatching). For example, the amorphizing impurity may be implanted into the contact spacers 134, thereby modifying the material of the contact spacers 134. Thus, after the PAI, the contact spacers 134 include the amorphizing impurity from the PAI. In some embodiments, a concentration of the amorphizing impurity in the contact spacers 134 is in the range of 0.01 at % to 1 at %.

Figure 21:
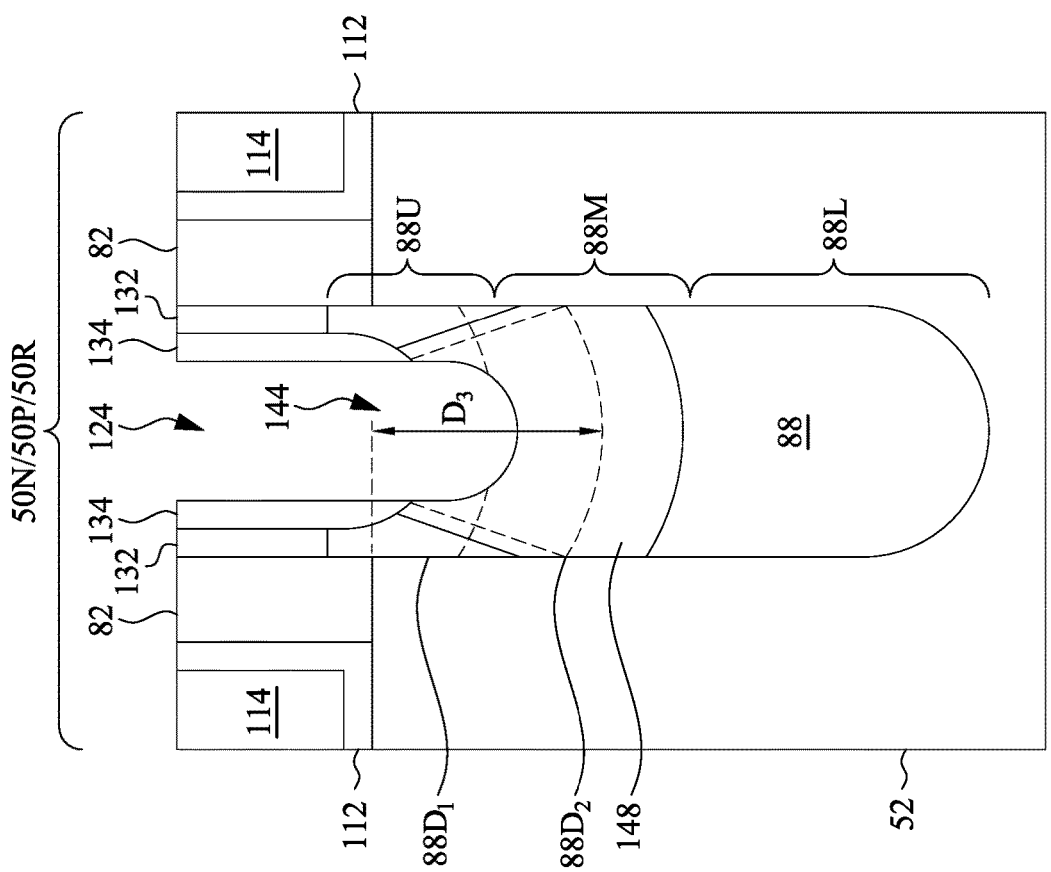

In FIG. 21, a second implantation process is performed to implant a dopant in the amorphous regions 148, thereby increasing the dopant concentration of the middle portions 88M of the epitaxial source/drain regions 88 and forming second highly-doped regions $88D_2$. The amorphous regions 148 will subsequently be re-crystallized, so that the second highly-doped regions $88D_2$ are part of the epitaxial source/drain regions 88. Metal-semiconductor alloy regions will subsequently be formed in/on the second highly-doped regions $88D_2$. The dopant implanted in the amorphous regions 148 to form the second highly-doped regions $88D_2$ has the same conductivity type as the epitaxial source/drain regions 88. Specifically, n-type dopants are implanted in the amorphous regions 148 in the n-type region 50N, and p-type dopants are implanted in the amorphous regions 148 in the p-type region 50P. The dopants may be any of the candidate dopants described for the first implantation process (described for FIG. 16). In some embodiments, the same dopant is implant by the first implantation process and the second implantation process.

The second implantation process is performed with a low implantation energy so that the implantation is shallow. In some embodiments, the implantation energy of the second implantation process may be in the range of 1 keV to 50 keV. As a result, the second implantation process results in the amorphous regions 148 being implanted to include the impurity therein, while the lower portions 88L of the epitaxial source/drain regions 88 are not implanted. Implanting the impurity in the amorphous regions 148 but not the lower portions 88L of the epitaxial source/drain regions 88 helps reduce device leakage. The implantation dosage may be in the range of 5 E13 $cm^{-2}$ to 1 E16 $cm^{-2}$. The implantation may be vertical or tilted, and the tilt angle may be smaller than 60 degrees. During the implantation, the temperature of the substrate 50 may be controlled to be in the range of −100° C. to 500° C. In some embodiments, the second highly-doped regions $88D_2$ have an dopant concentration in the range of 1 E21 $cm^{-3}$ to 3 E22 $cm^{-3}$.

Implanting the dopants in the amorphous regions 148 advantageously allows the second implantation process to achieve shallow implantation and lower dopant activation energy. Specifically, dopants are implanted in the amorphous regions 148 to a lesser depth and are activated to a greater level than they would be if they were implanted in crystallized regions. As a result, the second highly-doped regions $88D_2$ are proximate the recesses 144, and do not extend far into the epitaxial source/drain regions 88. In some embodiments, a distance $D_3$ between the top surfaces of the fins 52 and the bottoms of the second highly-doped regions $88D_2$ is in the range of 5 nm to 20 nm. In some embodiments, implanting the dopants in the amorphous regions 148 instead of in crystallized regions increases the dopant activation level by 5% to 50%. The second highly-doped regions $88D_2$ may thus be rich with dopants. Increasing the dopant concentration of the second highly-doped regions $88D_2$ helps increase the dopant concentration of subsequently formed metal-semiconductor alloy regions, thereby decreasing the contact resistance to the epitaxial source/drain regions 88. Additionally, implanting the dopants in the amorphous regions 148 after extending the recesses 144 helps reduce losses of the second highly-doped regions $88D_2$ from etching the epitaxial source/drain regions.

The contact spacers 134 may be implanted by the second implantation process. For example, some dopants may be implanted into the contact spacers 134, thereby modifying the material of the contact spacers 134. Thus, after the second implantation process, the contact spacers 134 further include the dopant from the second implantation process. In some embodiments, a concentration of the dopant in the contact spacers 134 is in the range of 0.5 at % to 1.5 at %. Additionally, the presence of these dopants in the contact spacers 134 may induce surface oxidation of the contact spacers 134. As such, the oxygen concentration of the contact spacers 134 may be increased by the second implantation process.

Figure 22:
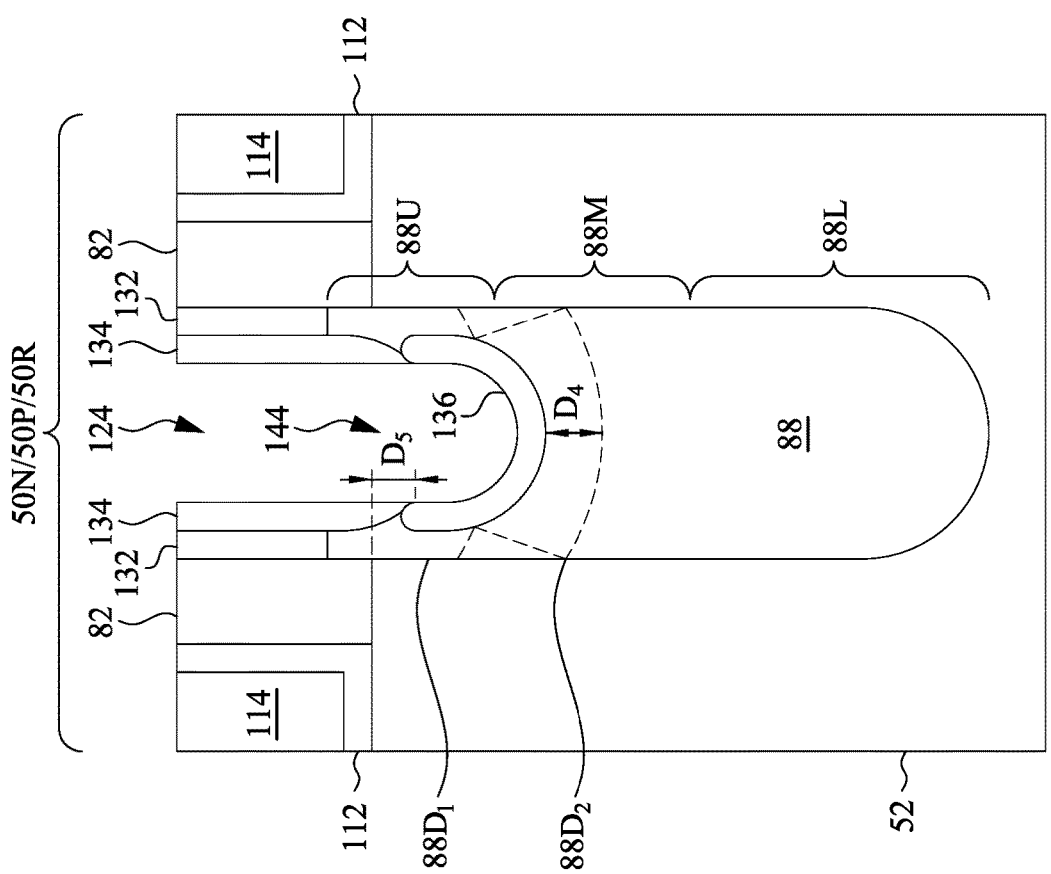

In FIG. 22, an anneal process is performed to re-crystallize the amorphous regions 148. More specifically, the lattice structure of the amorphous regions 148 is repaired by the anneal process, thereby crystallizing the amorphous regions 148 and eliminating the amorphous regions 148 from the epitaxial source/drain regions 88. In some embodiments, the anneal process includes a melt anneal process. In the melt anneal process, at least a portion of the epitaxial source/drain regions 88 is molten. The anneal process, in addition to the melt process, may or may not include other non-melt anneal processes such as, but not limited to, a millisecond anneal process, which may be performed using laser, UV light, a flash lamp, etc. In the non-melt anneal processes, no portion of the epitaxial source/drain regions 88 is molten. The non-melt anneal processes have the effect of activating the dopants in non-melted portions of the epitaxial source/drain regions 88 in addition to the molten portions of the epitaxial source/drain regions 88. Through the melt anneal process, the amorphous regions 148 are re-crystallized.

The amorphous regions 148 have a lower melting point than that of the un-amorphized portions of the epitaxial source/drain regions 88. The melt anneal may thus be controlled so that the temperature is greater than the melting point of the amorphous regions 148 and lower than the melting point of the un-amorphized portions of the epitaxial source/drain regions 88, so that the amorphous regions 148 are molten, while the un-amorphized portions of the epitaxial source/drain regions 88 are not molten.

After the re-crystallization process, the dopants in the highly-doped regions $88D_1$, $88D_2$ are activated. The recesses 144 extend through the first highly-doped regions $88D_1$, and extend into (but not through) the second highly-doped regions $88D_2$. The upper surfaces of the recesses 144 are defined by the first highly-doped regions $88D_1$, and the lower surfaces of the recesses 144 are defined by the second highly-doped regions $88D_2$. Performing the PAI (described for FIG. 20) and the second implantation process (described for FIG. 21) after the recesses 144 are extended advantageously allows a substantial portion of the surfaces of the recesses 144 to be defined by highly-doped regions even when the recesses 144 are deep. Further, the implant is shallow so that the second highly-doped regions $88D_2$ are proximate the recesses 144. In some embodiments, a distance $D_4$ between the bottoms of the recesses 144 and the bottoms of the second highly-doped regions $88D_2$ is in the range of 1 nm to 10 nm. The lower portions 88L of the epitaxial source/drain regions 88 are thus not implanted with the dopant implanted to form the second highly-doped regions $88D_2$, which can help reduce device leakage.

Following or prior to the re-crystallization process, metal-semiconductor alloy regions 136 are formed in/on the highly-doped regions $88D_1$, $88D_2$. The metal-semiconductor alloy regions 136 can be silicide regions formed of a metal silicide (e.g., titanium silicide, nickel silicide, platinum silicide, combinations thereof, etc.), germanide regions formed of a metal germanide (e.g. titanium germanide, nickel germanide, platinum germanide, combinations thereof, etc.), silicon-germanide regions formed of both a metal silicide and a metal germanide, or the like. The metal-semiconductor alloy regions 136 can be formed by depositing a metal in the recesses 144 and then performing an anneal process. The metal can be any metal capable of reacting with the semiconductor materials (e.g., silicon, silicon-germanium, germanium, etc.) of the epitaxial source/drain regions 88 to form a low-resistance metal-semiconductor alloy, such as titanium, nickel, platinum, cobalt, tantalum, tungsten, other noble metals, other refractory metals, rare earth metals or their alloys. The metal can be deposited by a deposition process such as ALD, CVD, PVD, or the like. Any suitable anneal process may be performed to react the metal with the highly-doped regions $88D_1$, $88D_2$ and thereby form the metal-semiconductor alloy regions 136. After the thermal anneal process, a cleaning process, such as a wet clean, may be performed to remove any residual metal from the recesses 144, such as from surfaces of the metal-semiconductor alloy regions 136.

In some embodiments, a single anneal process is utilized to both re-crystalize the amorphous regions 148 and form the metal-semiconductor alloy regions 136. For example, before the amorphous regions 148 are re-crystallized, the metal for the metal-semiconductor alloy regions 136 may be deposited in the recesses 144 and on the amorphous regions 148. An anneal process, such as the previously described melt anneal process, may then be performed.

When the metal-semiconductor alloy regions 136 are formed, dopants are drawn from the portions of the epitaxial source/drain regions 88 proximate the recesses 144. Because these portions of the epitaxial source/drain regions 88 (including the highly-doped regions $88D_1$, $88D_2$) are highly doped, the metal-semiconductor alloy regions 136 are formed to have a high dopant concentration. As will be subsequently described in greater detail, the metal-semiconductor alloy regions 136 may have a greater dopant concentration than the epitaxial source/drain regions 88. Forming the metal-semiconductor alloy regions 136 with a high dopant concentration helps reduce the contact resistance to the epitaxial source/drain regions 88. Further, because the recesses 144 are deep, the metal-semiconductor alloy regions 136 are disposed at an increased depth in the epitaxial source/drain regions 88, helping increase the contact area to the epitaxial source/drain regions 88. In some embodiments, a distance $D_5$ between the top surfaces of the fins 52 and the top surfaces of the metal-semiconductor alloy regions 136 is in the range of 0 nm to 10 nm, such as at least 2 nm. The metal-semiconductor alloy regions 136 are beneath the top surfaces of the fins 52 and the epitaxial source/drain regions 88.

Figure 23:
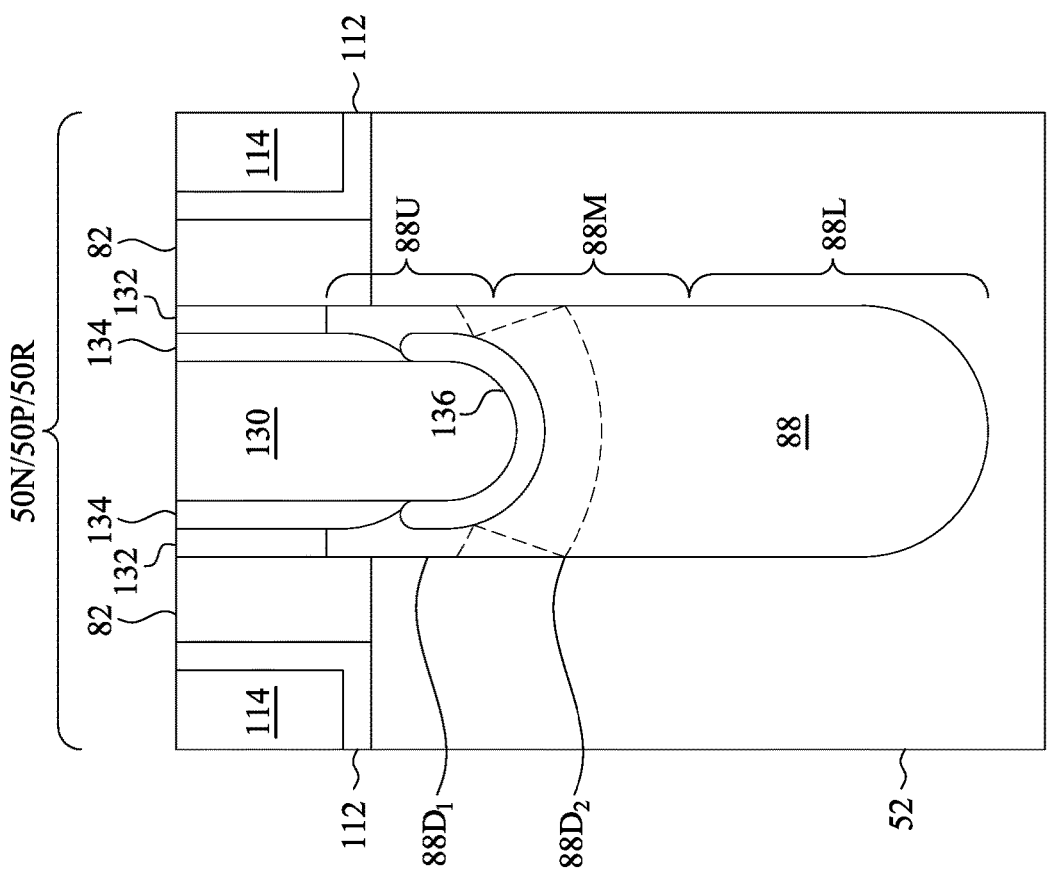

In FIG. 23, source/drain contacts 130 are formed in the recesses 144 and the contact openings 124. As an example to form the source/drain contacts 130, a liner (not separately illustrated), such as a diffusion barrier layer, an adhesion layer, or the like, and a conductive material may be formed in the recesses 144 and the contact openings 124. The liner may include titanium, titanium nitride, tantalum, tantalum nitride, or the like. The conductive material may be cobalt, tungsten, copper, a copper alloy, silver, gold, aluminum, nickel, or the like. Although not separately illustrated, the conductive material may also be formed on the top surfaces of the contact spacers 132, 134, the gate spacers 82, and the gate masks 116 (see FIG. 15C). A planarization process, such as a CMP, may be performed to remove excess material from the top surfaces of the gate spacers 82, the gate masks 116, and the contact spacers 132, 134. The remaining liner and conductive material form the source/drain contacts 130 in the recesses 144 and the contact openings 124. The contact spacers 134 separate the source/drain contacts 130 from the sidewalls of the upper portions 88U of the epitaxial source/drain regions 88 (e.g., the sidewalls that defined the recesses 144, see FIG. 22). Additionally, the contact spacers 134 may contact the metal-semiconductor alloy regions 136.

Figure 24B:
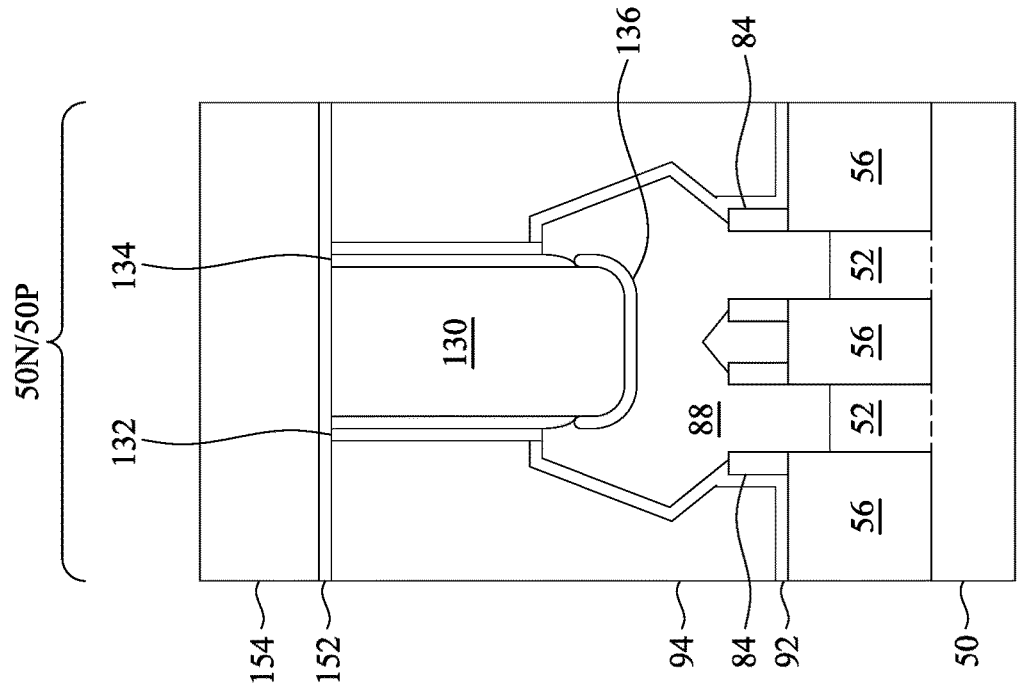
Figure 24A:
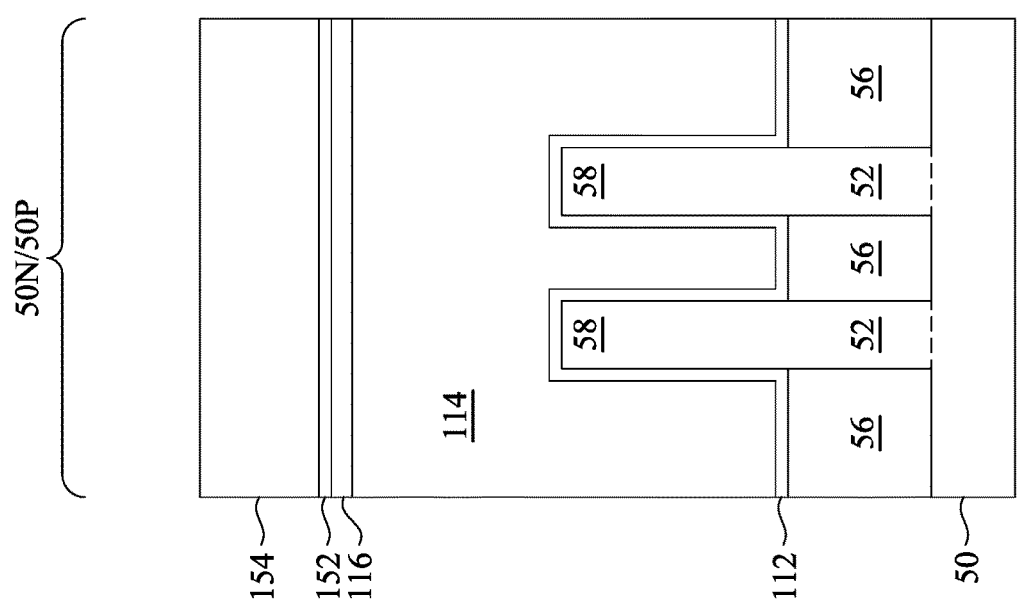
Figure 24C:
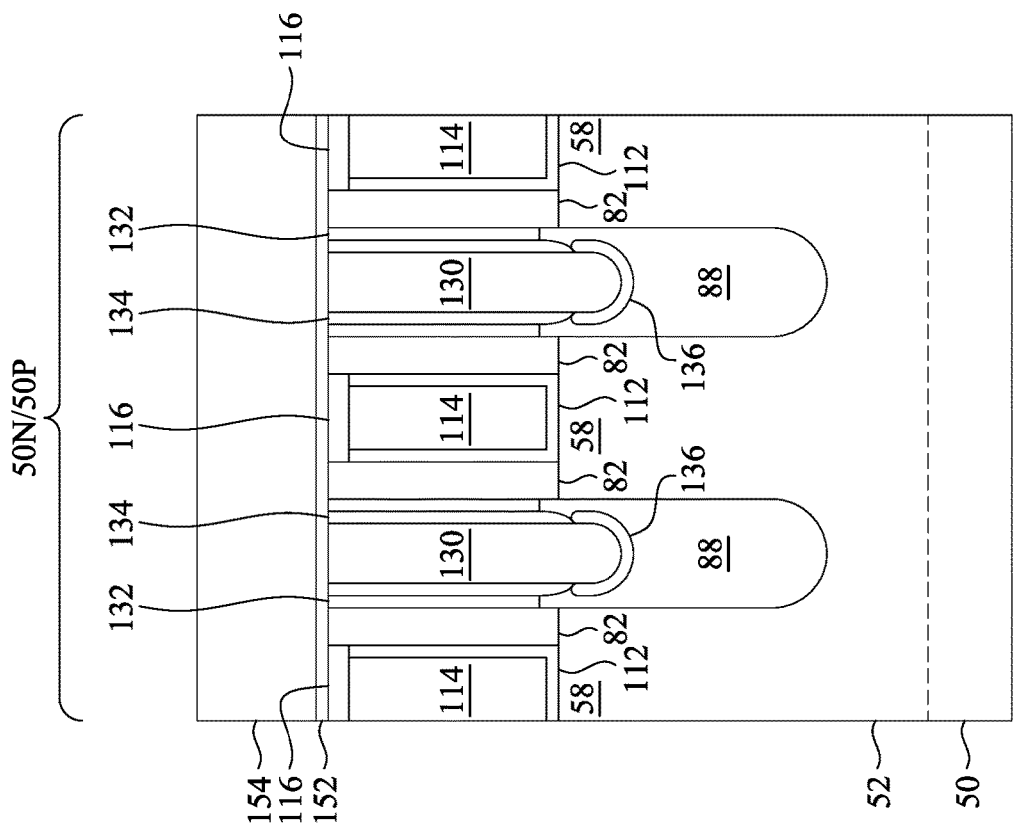

In FIGS. 24A-24C, a second ILD 154 is deposited over the gate spacers 82, the CESL 92, the first ILD 94, the gate masks 116, the source/drain contacts 130, and the contact spacers 132, 134. In some embodiments, the second ILD 154 is a flowable film formed by a flowable CVD method. In some embodiments, the second ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the second ILD 154 and the gate spacers 82, the CESL 92, the first ILD 94, the gate masks 116, the source/drain contacts 130, and the contact spacers 132, 134. The ESL 152 may include a dielectric material having a high etching selectivity from the etching of the second ILD 154, such as, silicon nitride, silicon oxide, silicon oxynitride, or the like.

Figure 25B:
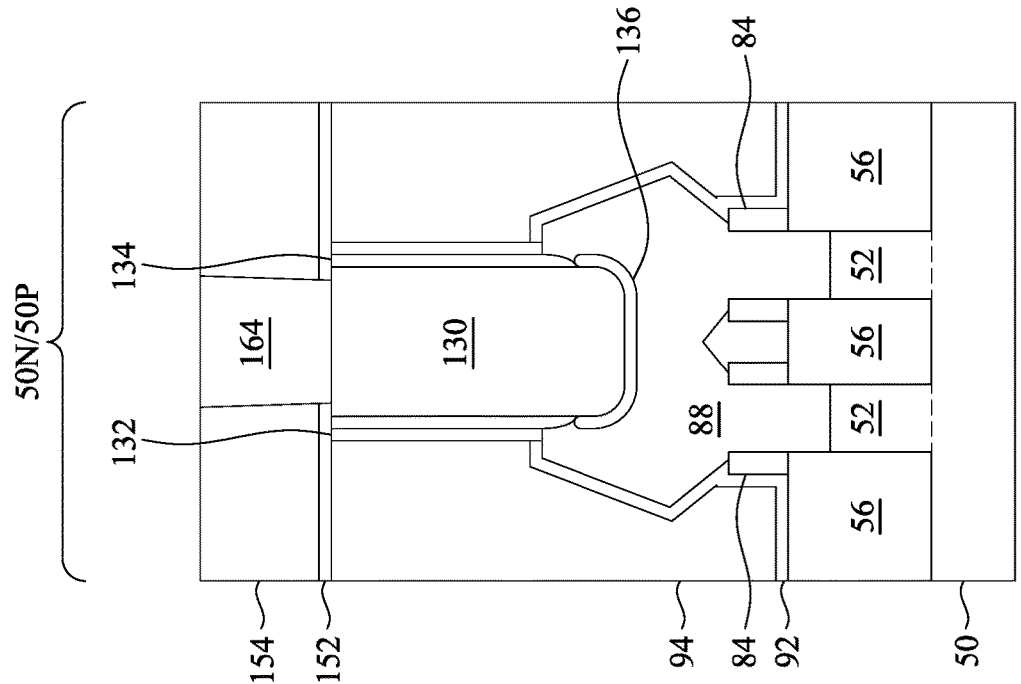
Figure 25A:
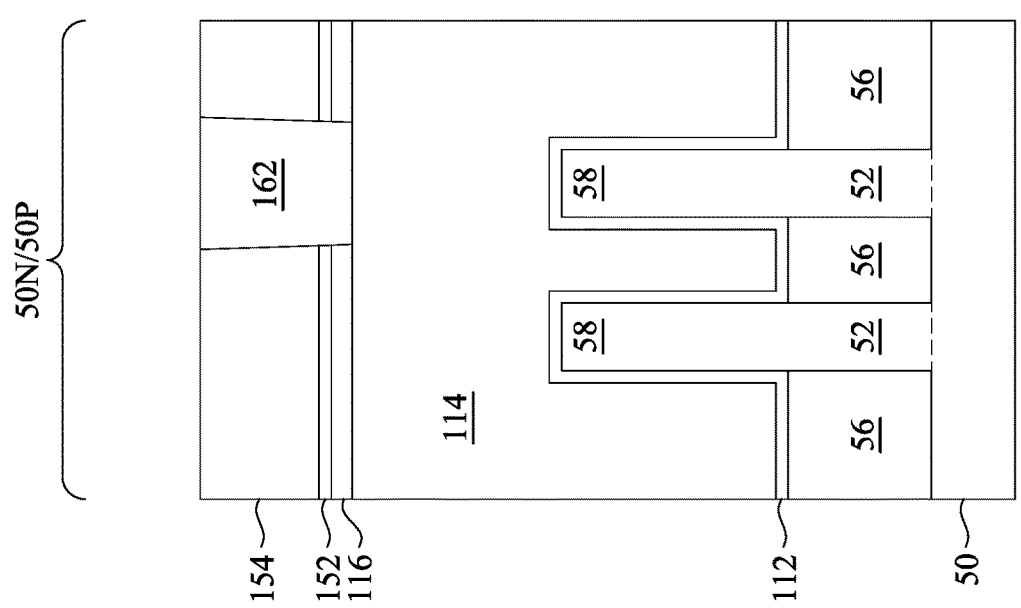
Figure 25C:
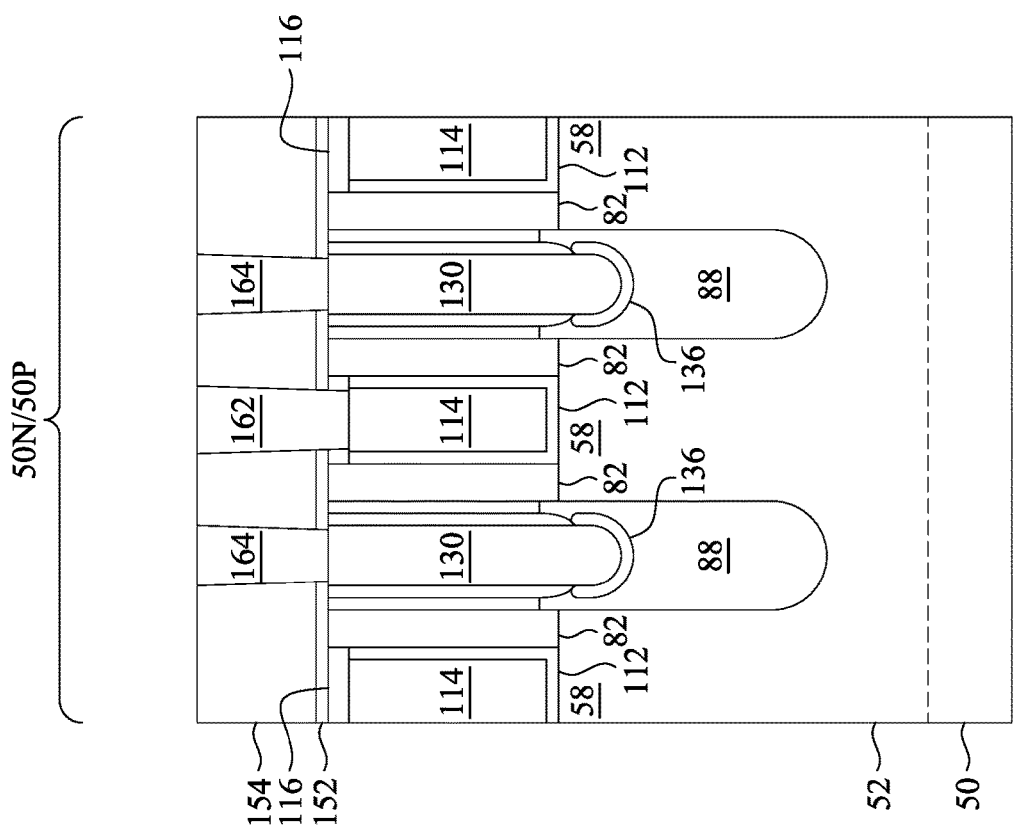

In FIGS. 25A-25C, gate contacts 162 and source/drain vias 164 are formed to contact, respectively, the gate electrodes 114 and the source/drain contacts 130. The gate contacts 162 are physically and electrically coupled to the gate electrodes 114. The source/drain vias 164 are physically and electrically coupled to the source/drain contacts 130.

As an example to form the gate contacts 162 and the source/drain vias 164, openings for the gate contacts 162 are formed through the second ILD 154, the ESL 152, and the gate masks 116, and openings for the source/drain vias 164 are formed through the second ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the second ILD 154. The remaining liner and conductive material form the gate contacts 162 and the source/drain vias 164 in the openings. The gate contacts 162 and the source/drain vias 164 may be formed in distinct processes, or may be formed in the same process. Although shown as being formed in the same cross-sections, it should be appreciated that each of the gate contacts 162 and the source/drain vias 164 may be formed in different cross-sections, which may avoid shorting of the contacts.

Figure 26C:
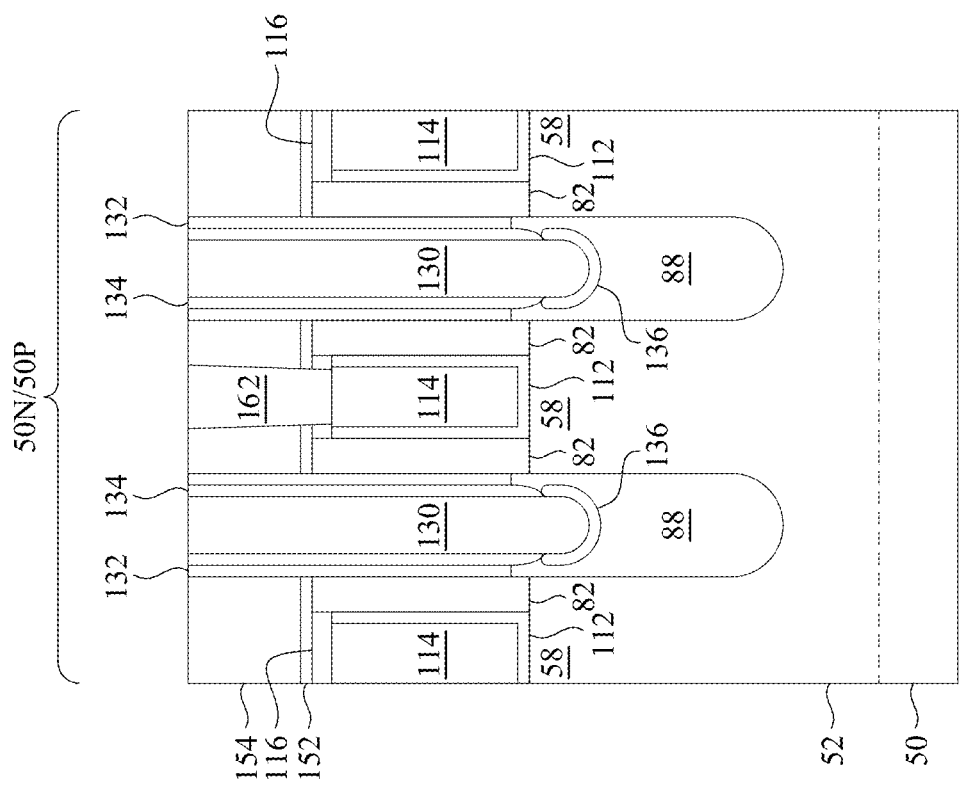

FIGS. 26A-26C are views of FinFETs, in accordance with some other embodiments. This embodiment is similar to the embodiment of FIGS. 25A-25C, except the source/drain vias 164 are omitted. Instead, the source/drain contacts 130 and the contact spacers 132, 134 are formed to also extend through the ESL 152 and the second ILD 154. As an example to form the devices of this embodiment, the processes described for FIGS. 13A-14C may be performed after the ESL 152 and the second ILD 154 are formed. Specifically, the mask 120 (see FIGS. 13A-13C) may be formed over the second ILD 154. The contact openings 124 (see FIGS. 14A-14C) may be formed through the second ILD 154, the ESL 152, the first ILD 94, and the CESL 92. The processes described for FIGS. 16-23 may then be performed in the contact openings 124.

Figure 27:
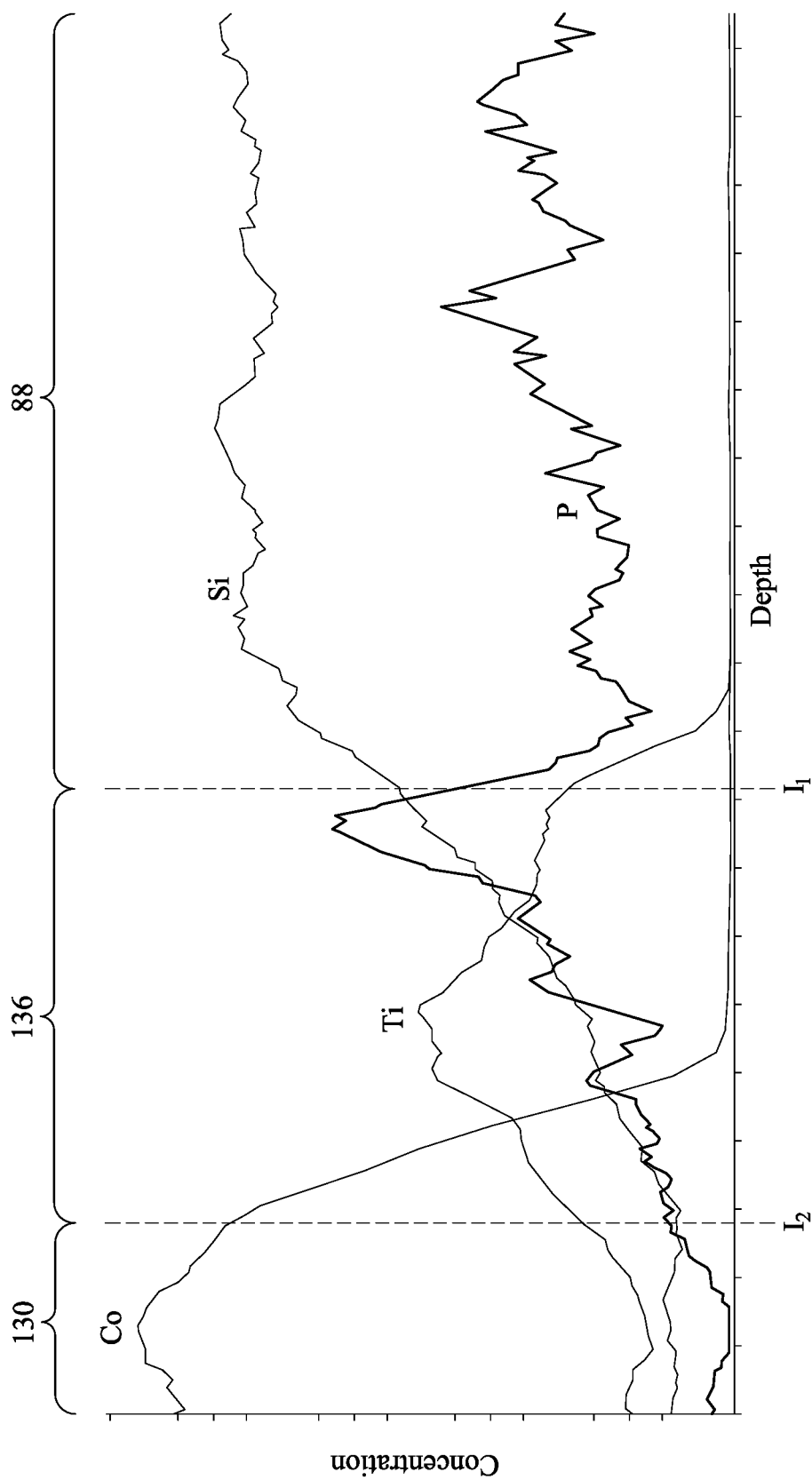
FIG. 27 is a spectrogram showing the concentration of various elements in embodiment devices.

FIG. 27 is a spectrogram showing the concentration of various elements in embodiment devices. The spectrogram was produced in an experiment using energy-dispersive X-ray spectroscopy (EDS). In this experiment, the source/drain contacts 130 were formed of cobalt (Co), the metal-semiconductor alloy regions 136 were formed of phosphorous-doped titanium silicide (TiSi), and the epitaxial source/drain regions 88 were formed of phosphorous-doped silicon (Si). As a result of the PAI and the implanting process previously described for FIGS. 16-23, the devices advantageously have an increased dopant concentration. The average dopant concentration in the metal-semiconductor alloy regions 136 may be improved by up to 10%. The metal-semiconductor alloy regions 136 have a high dopant concentration throughout. In some embodiments, the metal-semiconductor alloy regions 136 have an average dopant concentration in the range of 5 at % to 25 at %. The concentration of the dopant (e.g., phosphorous) in the metal-semiconductor alloy regions 136 is greater than the concentration of the dopant in the epitaxial source/drain regions 88. In some embodiments, the concentration of the dopant in the metal-semiconductor alloy regions 136 is from 1.1 to 4 times greater than the concentration of the dopant in the epitaxial source/drain regions 88.

Additionally, different portions of the metal-semiconductor alloy regions 136 may have different dopant concentrations. Specifically, lower portions of the metal-semiconductor alloy regions 136 may have a greater dopant concentration than upper portions of the metal-semiconductor alloy regions 136. In some embodiments, the concentration of the dopant in the lower portions of the metal-semiconductor alloy regions 136 is greater than the concentration of the dopant in the epitaxial source/drain regions 88, and the concentration of the dopant in the upper portions of the metal-semiconductor alloy regions 136 is less than the concentration of the dopant in the epitaxial source/drain regions 88. As shown in FIG. 27, the metal-semiconductor alloy regions 136 have a high dopant concentration proximate the first interfaces $I_1$ of the epitaxial source/drain regions 88 and the metal-semiconductor alloy regions 136. In some embodiments, the dopant concentration of the metal-semiconductor alloy regions 136 proximate the first interfaces $I_1$ is in the range of 3 at % to 15 at %. The dopant concentration of the metal-semiconductor alloy regions 136 proximate the first interfaces $I_1$ is greater than the dopant concentration of the metal-semiconductor alloy regions 136 proximate the second interfaces $I_2$ of the source/drain contacts 130 and the metal-semiconductor alloy regions 136. In some embodiments, the dopant concentration of the epitaxial source/drain regions 88 is greater than the dopant concentration of the metal-semiconductor alloy regions 136 proximate the second interfaces $I_2$, and the dopant concentration of the epitaxial source/drain regions 88 is less than the dopant concentration of the metal-semiconductor alloy regions 136 proximate the first interfaces $I_1$. Forming the metal-semiconductor alloy regions 136 with a high dopant concentration helps reduce the contact resistance to the epitaxial source/drain regions 88.

Embodiments may achieve advantages. Forming the recesses 144 so they extend deep into the epitaxial source/drain regions 88 increases the contact area to the epitaxial source/drain regions 88, which may reduce the contact resistance to the epitaxial source/drain regions 88. Performing the second implantation process after the recesses 144 are formed increases the dopant concentration in the portions of the epitaxial source/drain regions 88 at the bottoms of the recesses 144. Further, performing the PAI before the second implantation process improves dopant activation in the subsequently implanted portions of the epitaxial source/drain regions 88. The metal-semiconductor alloy regions 136 may thus be formed with a high dopant concentration. This may further reduce the contact resistance to the epitaxial source/drain regions 88.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the gate contacts 162 and the source/drain vias 164. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a device includes: a source/drain region adjacent a channel region; an inter-layer dielectric on the source/drain region; a source/drain contact extending through the inter-layer dielectric and into the source/drain region; a metal-semiconductor alloy region between the source/drain contact and the source/drain region, the metal-semiconductor alloy region disposed beneath a top surface of the channel region, the metal-semiconductor alloy region including a first dopant; and a contact spacer around the source/drain contact, the contact spacer including the first dopant and an amorphizing impurity. In some embodiments of the device, the first dopant has the same conductivity type as the source/drain region. In some embodiments of the device, the source/drain region is an n-type source/drain region and the first dopant is phosphorous, arsenic, or tin. In some embodiments of the device, the source/drain region is a p-type source/drain region and the first dopant is boron, boron fluoride, or gallium. In some embodiments of the device, the amorphizing impurity is germanium, xenon, argon, or silicon. In some embodiments of the device, the contact spacer is disposed between the source/drain contact and an upper portion of the source/drain region.

In an embodiment, a device includes: a source/drain region adjacent a channel region, the source/drain region including a first dopant; an inter-layer dielectric on the source/drain region; a source/drain contact extending through the inter-layer dielectric and into the source/drain region, the source/drain contact extending beneath a top surface of the channel region; and a metal-semiconductor alloy region between the source/drain contact and the source/drain region, the metal-semiconductor alloy region including the first dopant, a lower portion of the metal-semiconductor alloy region having a greater concentration of the first dopant than the source/drain region, an upper portion of the metal-semiconductor alloy region having a lesser concentration of the first dopant than the source/drain region. In some embodiments of the device, the metal-semiconductor alloy region has a first concentration of the first dopant proximate a first interface of the source/drain region and the metal-semiconductor alloy region, and the metal-semiconductor alloy region has a second concentration of the first dopant proximate a second interface of the source/drain contact and the metal-semiconductor alloy region, the first concentration greater than the second concentration. In some embodiments of the device, the source/drain region has a third concentration of the first dopant, the third concentration less than the first concentration, the third concentration greater than the second concentration. In some embodiments, the device further includes: a contact spacer between the source/drain contact and an upper portion of the source/drain region, the contact spacer including the first dopant. In some embodiments of the device, the contact spacer further includes an amorphizing impurity, the amorphizing impurity different from the first dopant.

In an embodiment, a method includes: forming a first highly-doped region in an epitaxial source/drain region by implanting a first dopant in a first portion of the epitaxial source/drain region; etching a recess in the epitaxial source/drain region, the recess extending through the first highly-doped region; forming an amorphous region in the epitaxial source/drain region by implanting an amorphizing impurity in a second portion of the epitaxial source/drain region, the second portion of the epitaxial source/drain region disposed at a bottom of the recess; forming a second highly-doped region in the epitaxial source/drain region by implanting the first dopant in the amorphous region; and annealing the epitaxial source/drain region to crystallize the amorphous region. In some embodiments, the method further includes: depositing a metal on the first highly-doped region and the second highly-doped region; and reacting the metal with the first highly-doped region and the second highly-doped region to form a metal-semiconductor alloy region in the recess. In some embodiments, the method further includes: forming a source/drain contact in the recess and on the metal-semiconductor alloy region. In some embodiments of the method, the amorphizing impurity has an atomic mass greater than 28, and implanting the amorphizing impurity in the second portion of the epitaxial source/drain region includes: implanting the amorphizing impurity with an implantation energy in a range of 1 keV to 50 keV. In some embodiments of the method, the amorphizing impurity is germanium, xenon, argon, or silicon. In some embodiments of the method, etching the recess in the epitaxial source/drain region includes: etching the recess in the epitaxial source/drain region to a first depth, the first depth less than a height of the first highly-doped region; and extending the recess into the epitaxial source/drain region to second depth, the second depth greater than the height of the first highly-doped region. In some embodiments, the method further includes: forming a contact spacer in the recess, where the amorphizing impurity and the first dopant are implanted in the contact spacer. In some embodiments of the method, the first dopant has the same conductivity type as the epitaxial source/drain region. In some embodiments of the method, the first dopant is not implanted in a third portion of the epitaxial source/drain region, the third portion of the epitaxial source/drain region beneath the second portion of the epitaxial source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first highly-doped region in an epitaxial source/drain region by implanting a first dopant in a first portion of the epitaxial source/drain region;
    etching a recess in the epitaxial source/drain region, the recess extending through the first highly-doped region;

forming an amorphous region in the epitaxial source/drain region by implanting an amorphizing impurity in a second portion of the epitaxial source/drain region, the second portion of the epitaxial source/drain region disposed at a bottom of the recess;

forming a second highly-doped region in the epitaxial source/drain region by implanting the first dopant in the amorphous region; and annealing the epitaxial source/drain region to crystallize the amorphous region.

2. The method of claim 1 further comprising:
depositing a metal on the first highly-doped region and the second highly-doped region; and
reacting the metal with the first highly-doped region and the second highly-doped region to form a metal-semiconductor alloy region in the recess.

3. The method of claim 2 further comprising:
forming a source/drain contact in the recess and on the metal-semiconductor alloy region.

4. The method of claim 1, wherein the amorphizing impurity has an atomic mass greater than 28, and the implanting an amorphizing impurity in the second portion of the epitaxial source/drain region comprises:
implanting the amorphizing impurity with an implantation energy in a range of 1 keV to 50 keV.

5. The method of claim 4, wherein the amorphizing impurity is germanium, xenon, argon, or silicon.

6. The method of claim 1, wherein etching the recess in the epitaxial source/drain region comprises:
etching the recess in the epitaxial source/drain region to a first depth, the first depth less than a height of the first highly-doped region; and
extending the recess into the epitaxial source/drain region to a second depth, the second depth greater than the height of the first highly-doped region.

7. The method of claim 1 further comprising:
forming a contact spacer in the recess, wherein the amorphizing impurity and the first dopant are implanted in the contact spacer.

8. The method of claim 1, wherein the first dopant has the same conductivity type as the epitaxial source/drain region.

9. The method of claim 1, wherein the first dopant is not implanted in a third portion of the epitaxial source/drain region, the third portion of the epitaxial source/drain region beneath the second portion of the epitaxial source/drain region.

10. A method comprising:
growing an epitaxial source/drain region adjacent a channel region;
etching a recess in the epitaxial source/drain region, the recess extending beneath the channel region;
forming an amorphous region in the epitaxial source/drain region by implanting an amorphizing impurity in a portion of the epitaxial source/drain region, the portion of the epitaxial source/drain region disposed at a bottom of the recess;
forming a highly-doped region in the epitaxial source/drain region by implanting a first dopant in the amorphous region, the first dopant different from the amorphizing impurity; and
annealing the epitaxial source/drain region to crystallize the amorphous region.

11. The method of claim 10 further comprising:
depositing a metal on the highly-doped region; and
reacting the metal with the highly-doped region to form a metal-semiconductor alloy region in the recess.

12. The method of claim 11 further comprising:
forming a source/drain contact in the recess and on the metal-semiconductor alloy region.

13. The method of claim 10, wherein etching the recess in the epitaxial source/drain region comprises:
etching the recess in the epitaxial source/drain region to a first depth;
forming a contact spacer in the recess; and
extending the recess into the epitaxial source/drain region to a second depth.

14. The method of claim 13, wherein the amorphizing impurity and the first dopant are implanted in the contact spacer.

15. The method of claim 10, wherein the first dopant has the same conductivity type as the epitaxial source/drain region before forming the amorphous region.

16. The method of claim 10, wherein annealing the epitaxial source/drain region comprises:
performing a melt anneal process to re-crystallize the amorphous region, wherein a melting point of the amorphous region is lower than a melting point of non-amorphized portions of the epitaxial source/drain region.

17. A method comprising:
forming a first highly-doped region in a source/drain region by implanting a first dopant using a first implantation energy in a range of 1 keV to 50 keV;
forming a recess in the source/drain region, the recess extending through the first highly-doped region;
forming an amorphous region in the source/drain region by implanting an amorphizing impurity at a bottom of the recess;
forming a second highly-doped region in the source/drain region by implanting a second dopant in the amorphous region using a second implantation energy in a range of 1 keV to 50 keV, the first dopant and the second dopant having the same conductivity type; and
re-crystallizing the amorphous region and activating the first dopant and the second dopant by performing an anneal process.

18. The method of claim 17, further comprising:
forming a metal-semiconductor alloy in the recess, the metal-semiconductor alloy contacting the first highly-doped region and the second highly-doped region.

19. The method of claim 17, wherein the amorphizing impurity is germanium, xenon, argon, or silicon.

20. The method of claim 17, further comprising:
forming a contact spacer in the recess prior to forming the amorphous region, the amorphizing impurity and the second dopant being implanted into the contact spacer.

* * * * *